(12) United States Patent
Tobita

(10) Patent No.: US 10,762,865 B2
(45) Date of Patent: Sep. 1, 2020

(54) SCANNING-LINE DRIVE CIRCUIT

(71) Applicant: MITSUBISHI ELECTRIC CORPORATION, Chiyoda-ku (JP)

(72) Inventor: Youichi Tobita, Tokyo (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 86 days.

(21) Appl. No.: 15/395,547

(22) Filed: Dec. 30, 2016

(65) Prior Publication Data

US 2017/0110077 A1 Apr. 20, 2017

Related U.S. Application Data

(62) Division of application No. 13/022,875, filed on Feb. 8, 2011, now abandoned.

(30) Foreign Application Priority Data

May 25, 2010 (JP) ................. 2010-119118

(51) Int. Cl.
G09G 3/36 (2006.01)
H03K 5/156 (2006.01)
H03K 5/135 (2006.01)
G11C 27/04 (2006.01)

(52) U.S. Cl.
CPC .......... *G09G 3/3677* (2013.01); *G11C 27/04* (2013.01); *H03K 5/135* (2013.01); *H03K 5/156* (2013.01); *G09G 2300/0871* (2013.01); *G09G 2310/08* (2013.01)

(58) Field of Classification Search
CPC .. G11C 27/04; G09G 3/3677; G09G 2310/08; H03K 5/156; H03K 5/135
See application file for complete search history.

(56) References Cited

U.S. PATENT DOCUMENTS

| 5,821,781 A | 10/1998 | Rigazio | |
|---|---|---|---|
| 2007/0247932 A1* | 10/2007 | Tobita | ................. G09G 3/3677 365/189.12 |
| 2007/0248204 A1* | 10/2007 | Tobita | .................... G11C 19/28 377/64 |

(Continued)

FOREIGN PATENT DOCUMENTS

| JP | 2002-162928 | 6/2002 |
|---|---|---|
| JP | 2004-227751 A | 8/2004 |

(Continued)

OTHER PUBLICATIONS

Office Action dated Aug. 27, 2013, in Japanese Patent Application No. 2010-119118 with Partial English translation.

*Primary Examiner* — Abbas I Abdulselam
(74) *Attorney, Agent, or Firm* — Oblon, McClelland, Maier & Neustadt, L.L.P.

(57) ABSTRACT

A gate-line drive circuit is driven by three clock signals of different phases, and includes a plurality of cascade-connected unit shift registers. In a normal operation, activation periods of the three clock signals do not overlap one another. However, the two clock signals of them are simultaneously activated at the beginning of a frame period. A unit shift register of the first stage is adapted to activate an output signal in accordance with the simultaneous activation of the two clock signals.

9 Claims, 36 Drawing Sheets

(56) References Cited

U.S. PATENT DOCUMENTS

2007/0274433 A1* 11/2007 Tobita .................. G09G 3/3677
377/64
2008/0122774 A1* 5/2008 Jo ........................ G09G 3/3677
345/94

FOREIGN PATENT DOCUMENTS

| JP | 2006-269002 | 10/2006 |
|---|---|---|
| JP | 2008-122939 A | 5/2008 |

* cited by examiner

F I G . 2
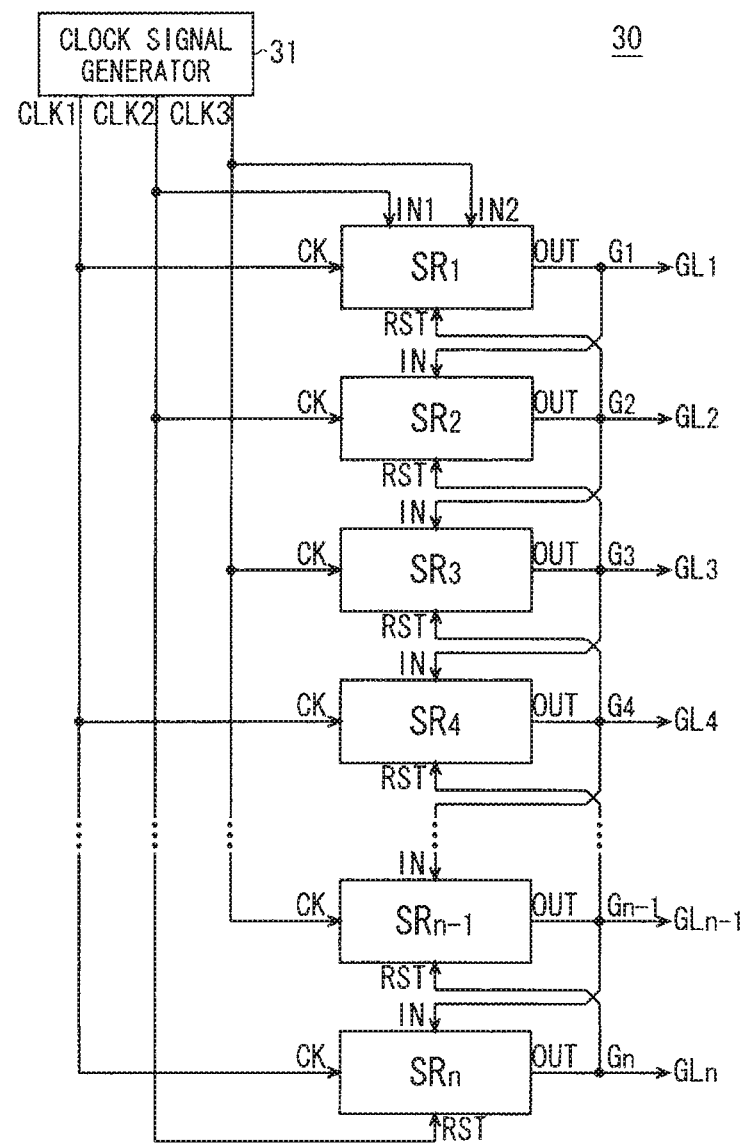

F I G. 3
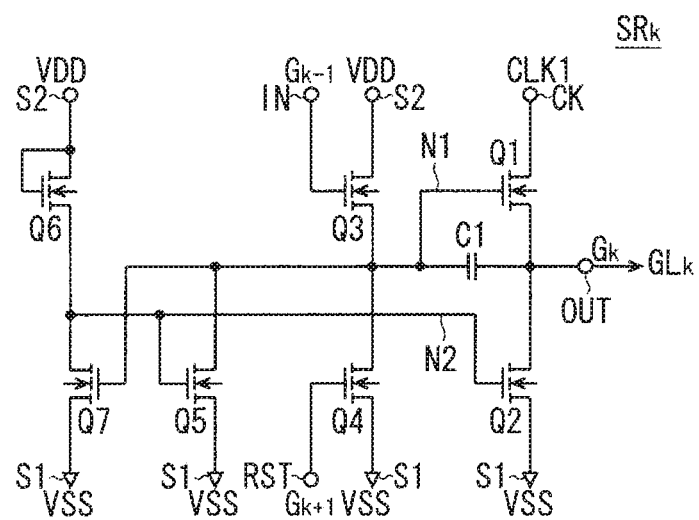
F I G. 4
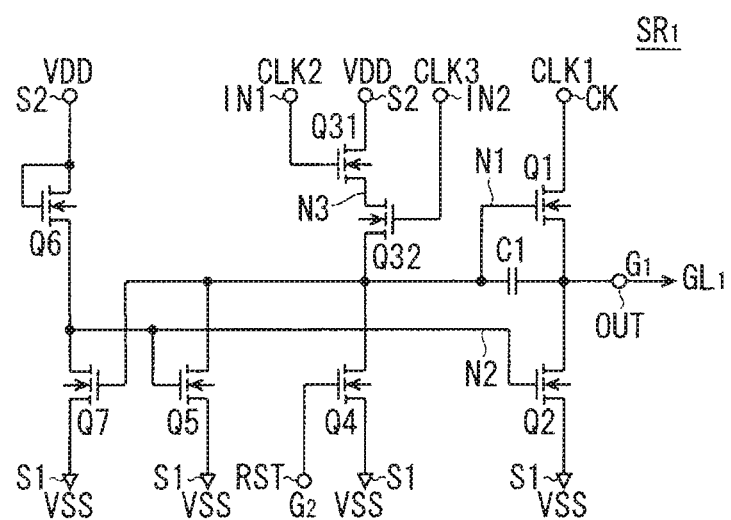

F I G. 5
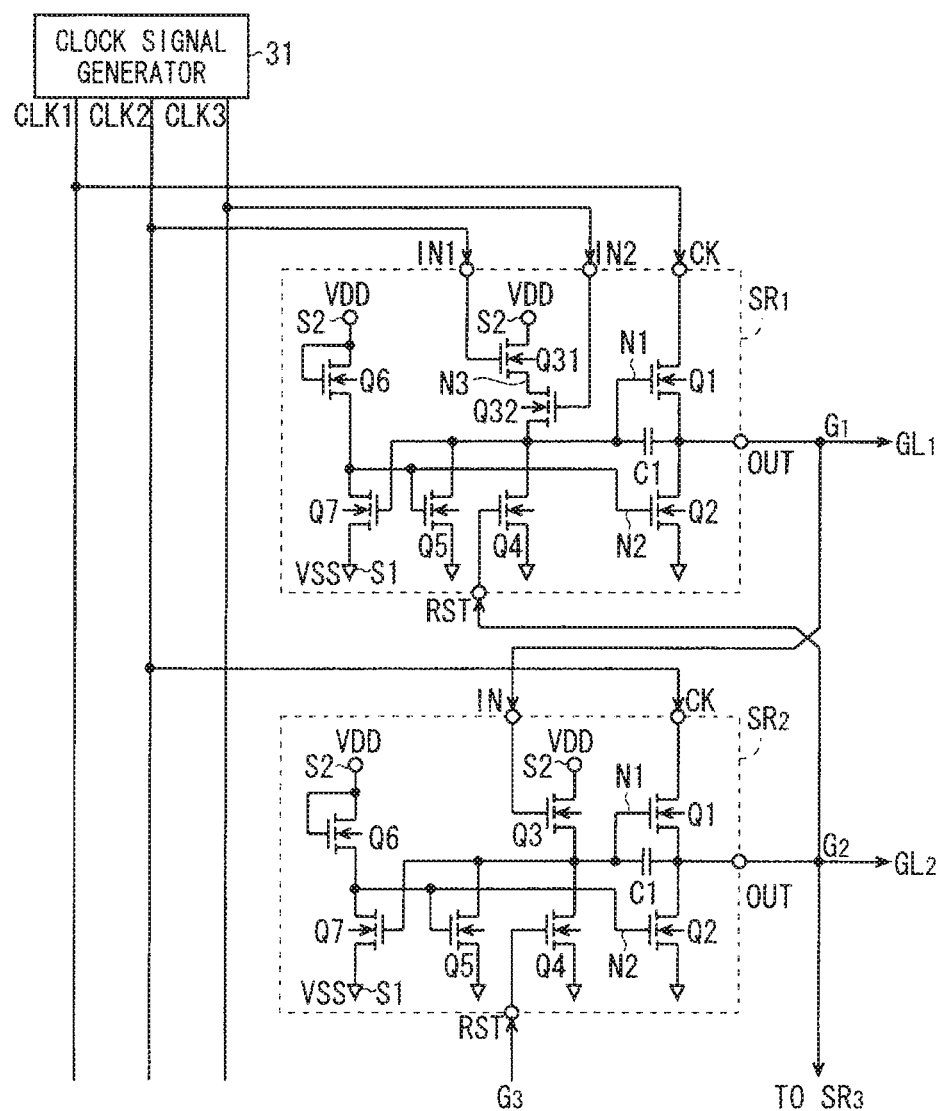

F I G. 6
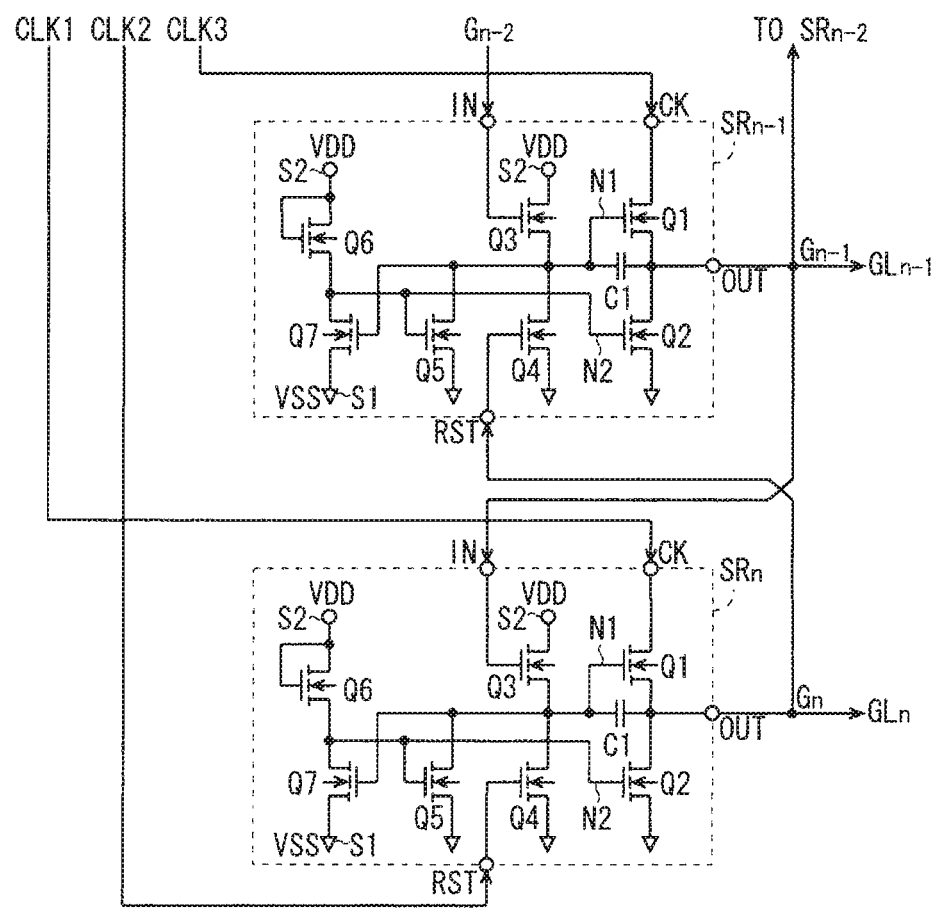

F I G . 1 2
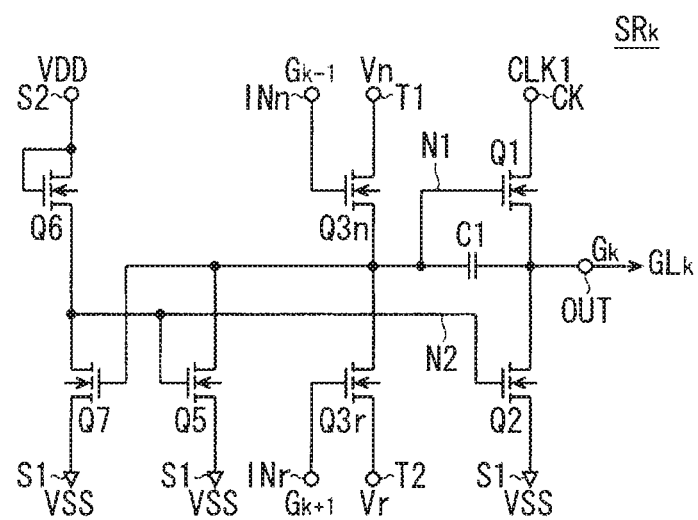

F I G. 1 3
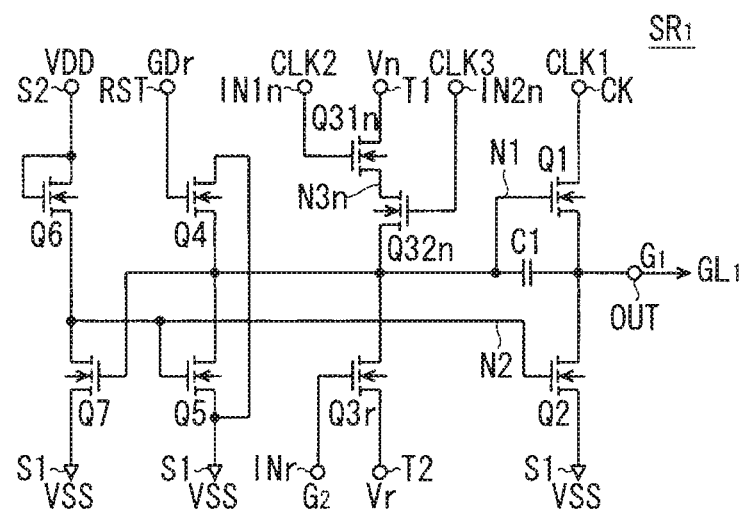
F I G. 1 4
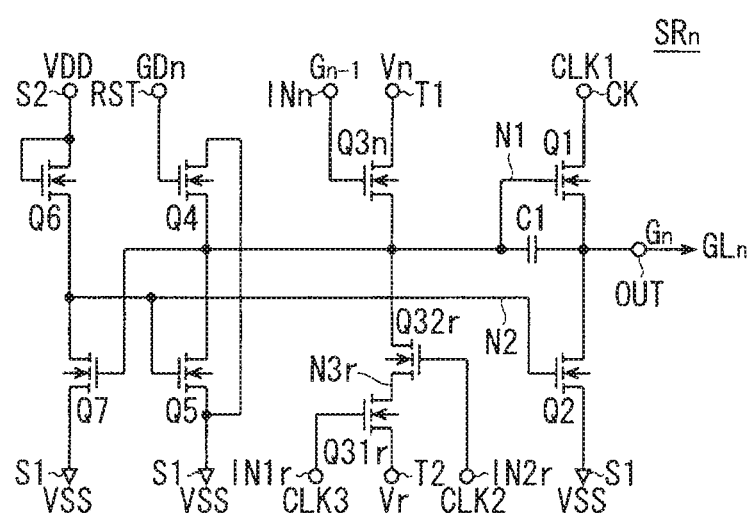

F I G. 1 5
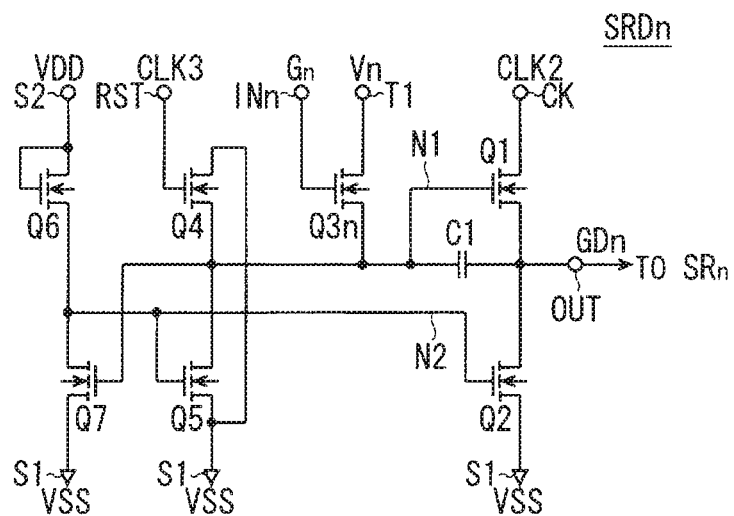
F I G. 1 6
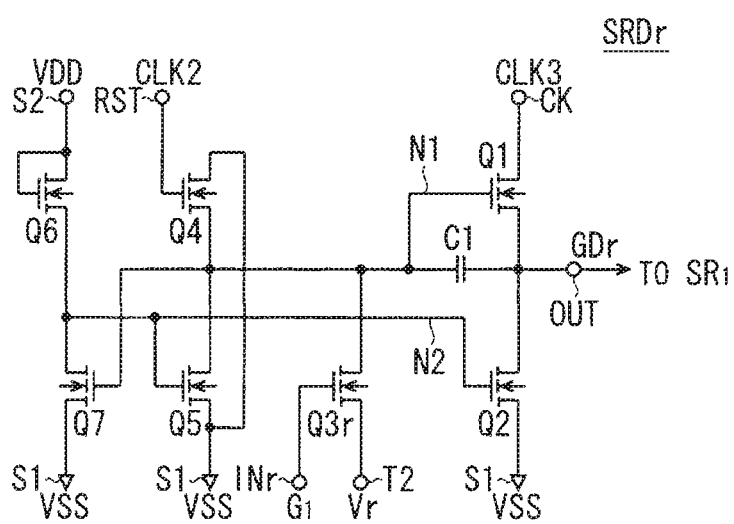

F I G . 1 8
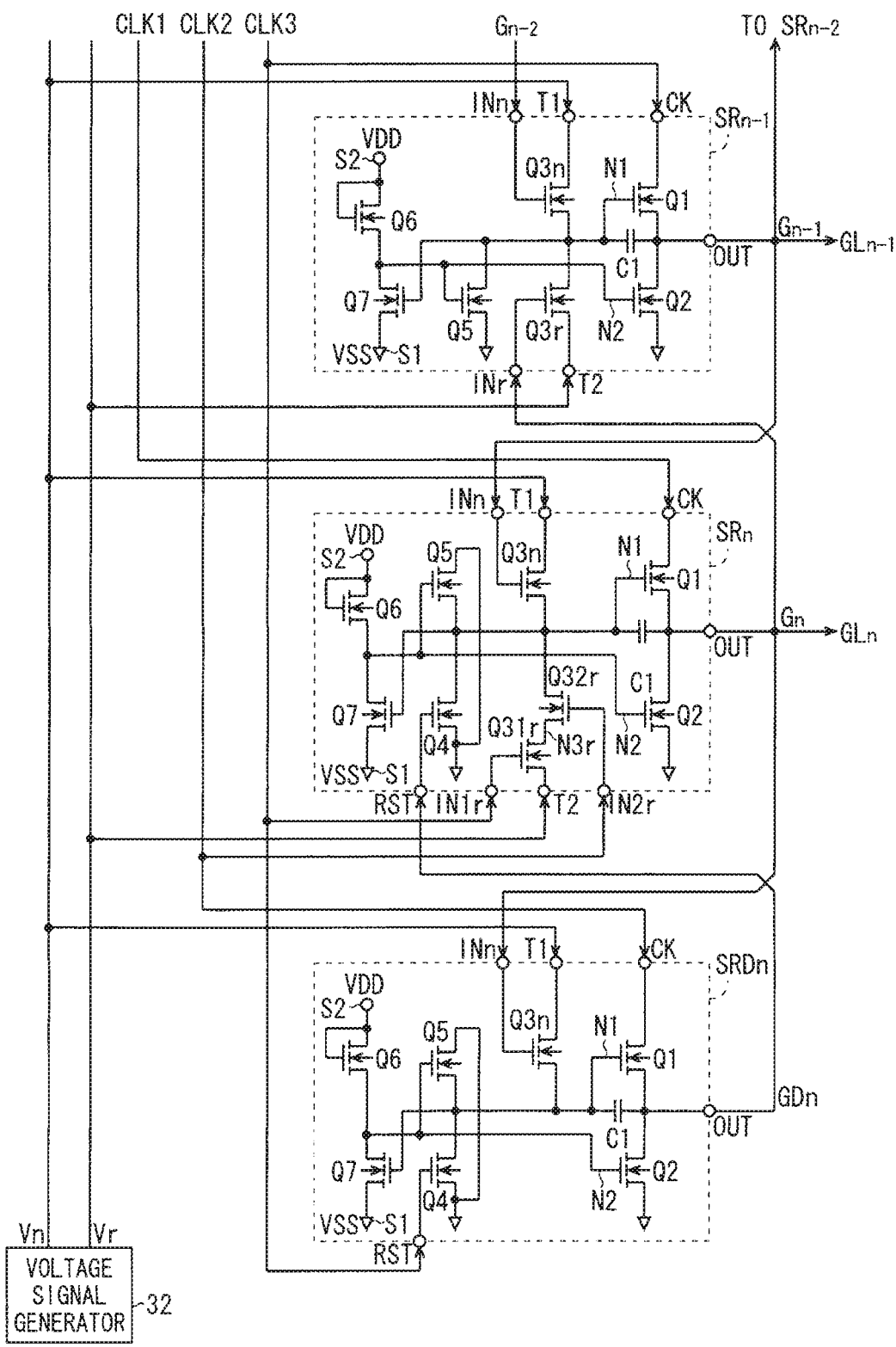

F I G . 2 1
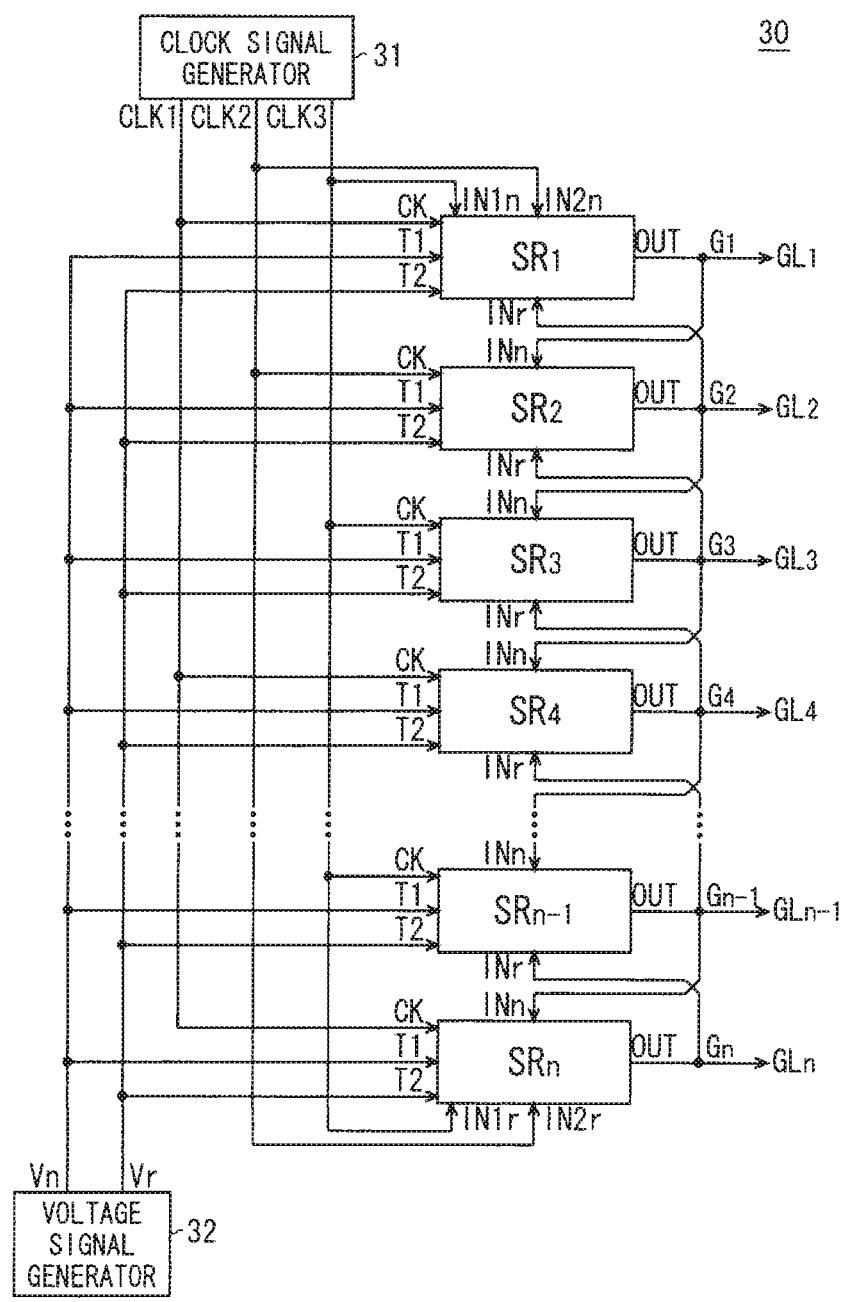

F I G . 2 4
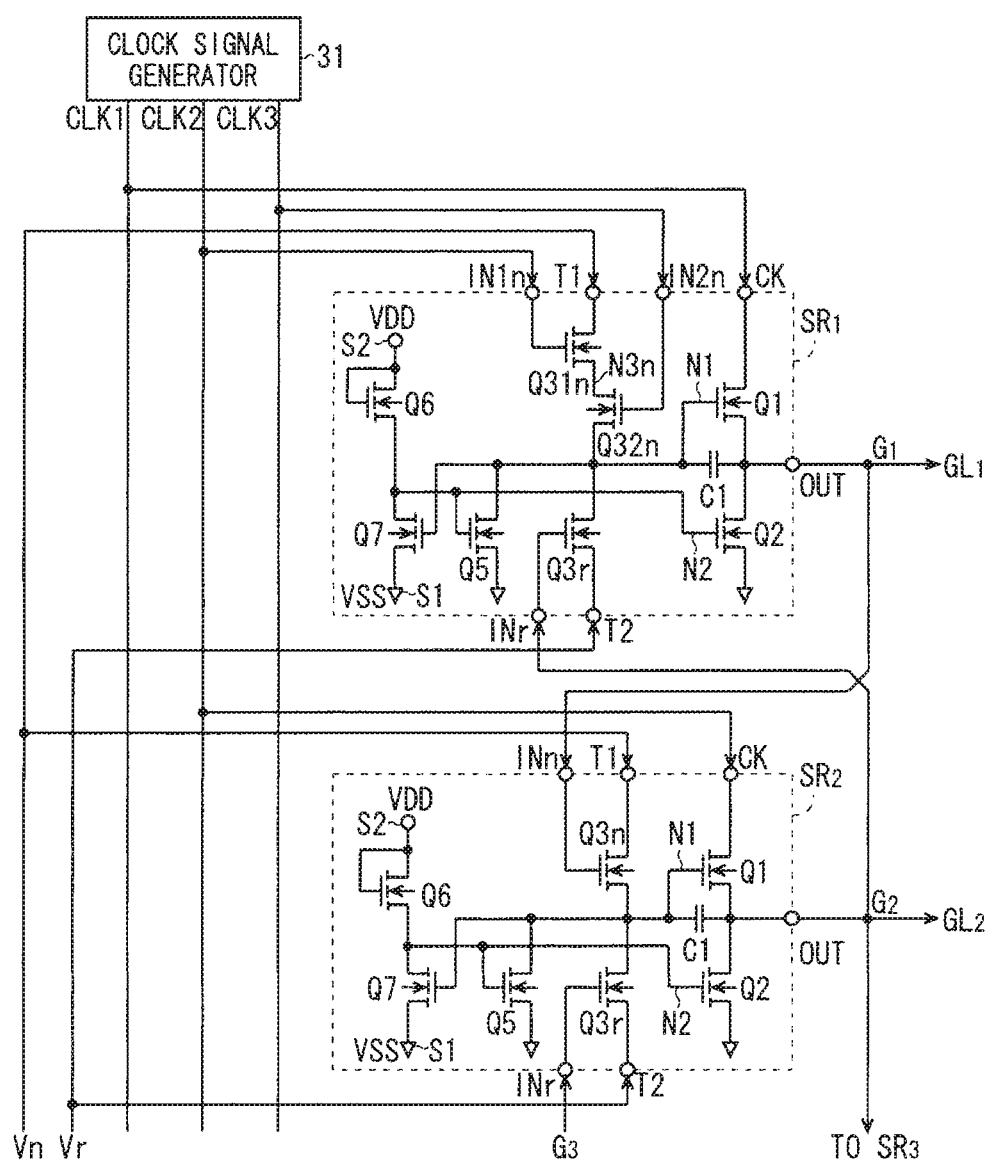

F I G . 2 6
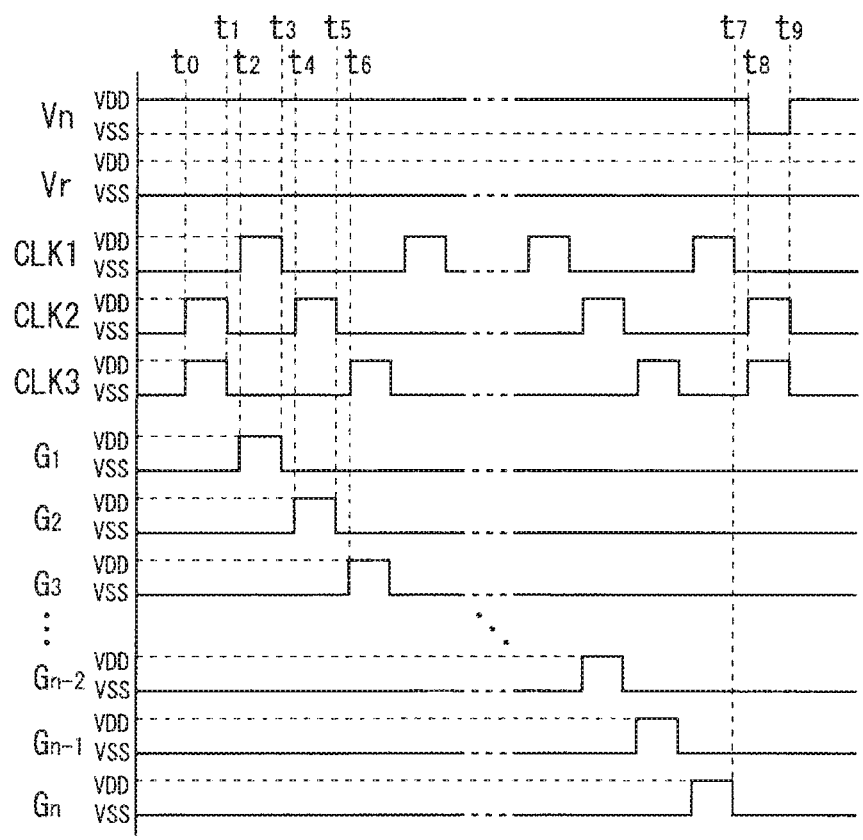

F I G . 4 0
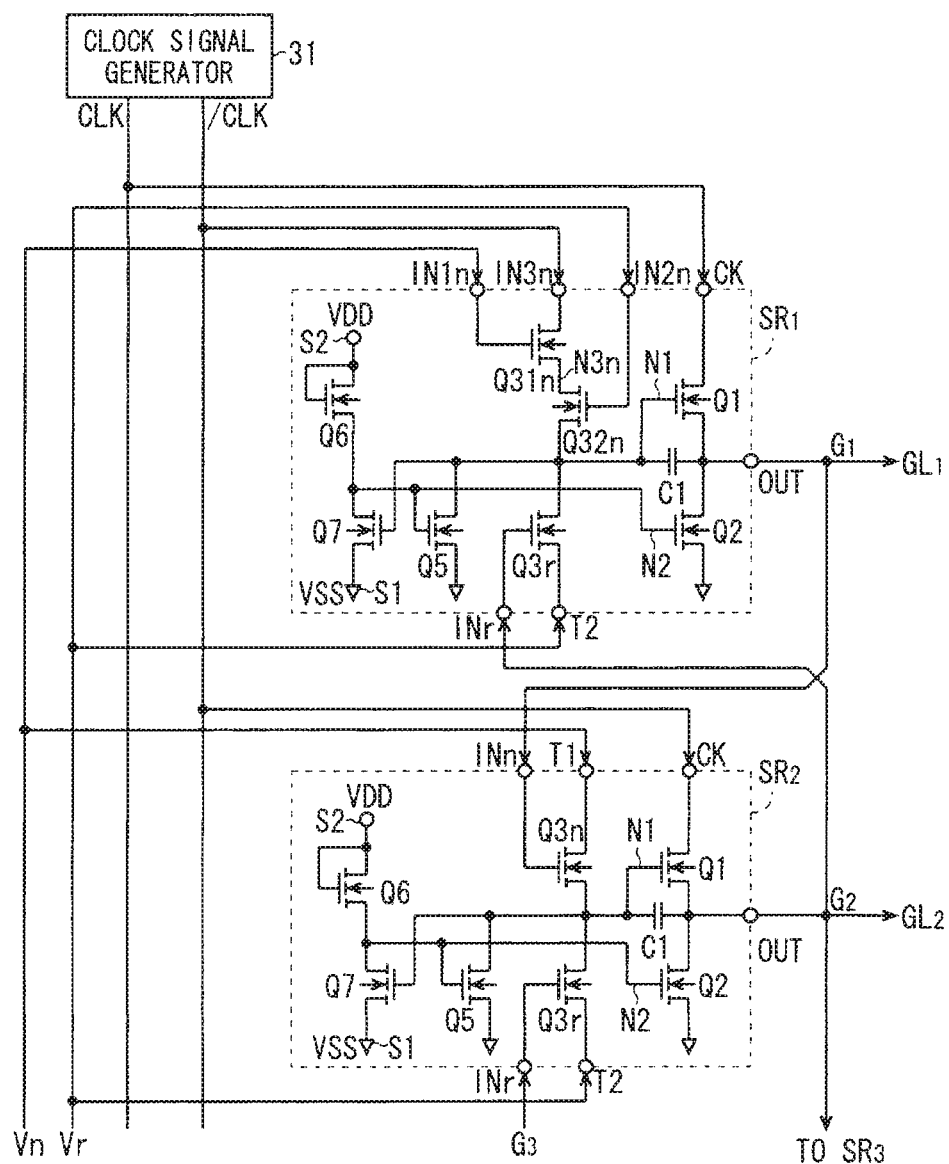

F I G . 4 1
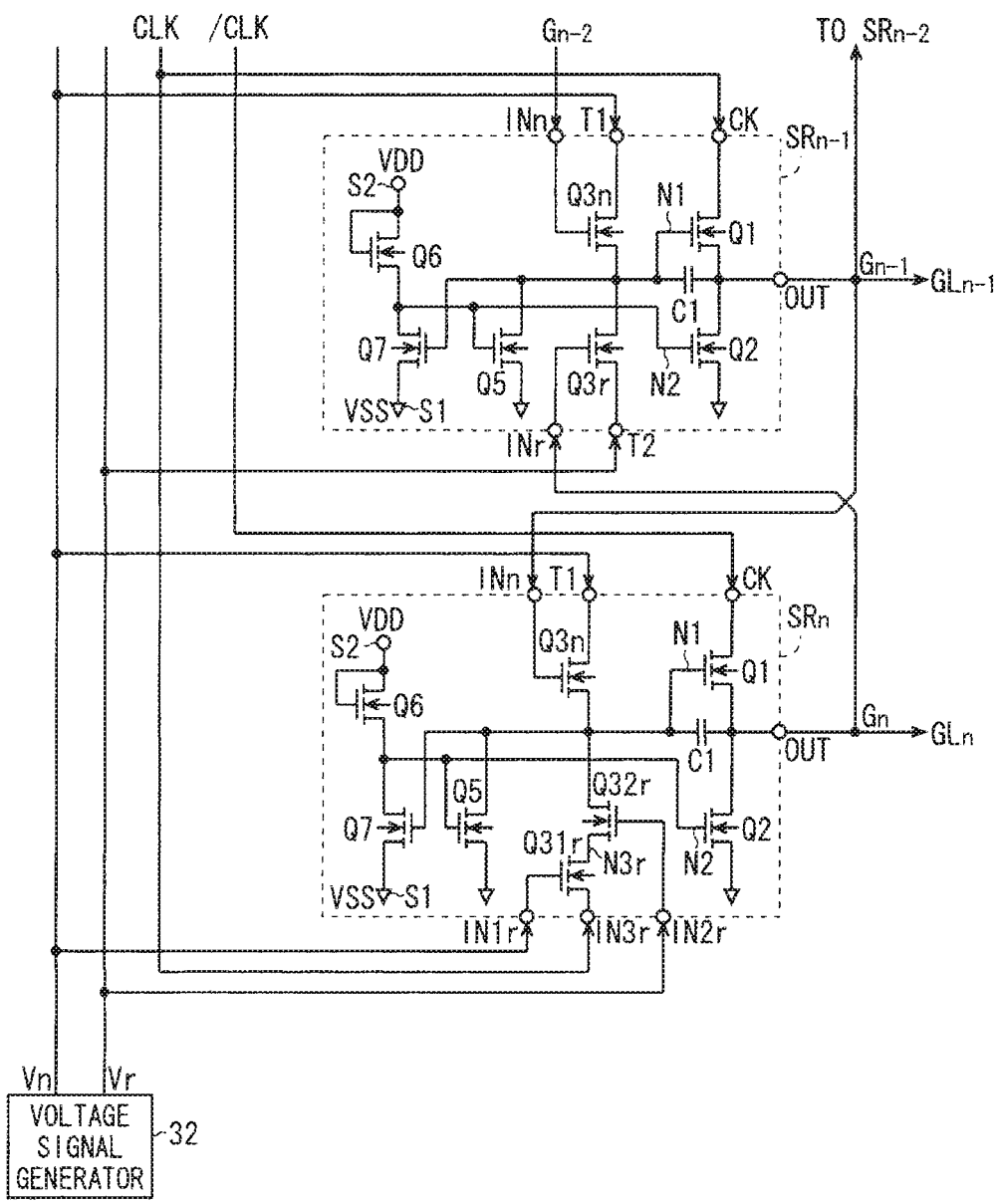

SCANNING-LINE DRIVE CIRCUIT

CROSS-REFERENCE TO RELATED APPLICATIONS

This application is a divisional application of U.S. patent application Ser. No. 13/022,875, filed Feb. 8, 2011, which is based upon and claims the benefit of priority from Japanese Patent Application No. 2010-119118, filed May 25, 2010; the entire contents of each of which are incorporated herein by reference.

BACKGROUND OF THE INVENTION

Field of the Invention

The present invention relates to a scanning-line drive circuit used in an electro-optical device such as an image display device and an imaging device, and particularly to a scanning-line drive circuit configured with only field effect transistors of the same conductivity type.

Description of the Background Art

An electro-optical device including a scanning-line drive circuit connected to a scanning line and scanning pixels is widely known. For example, in an image display device (hereinafter, referred to as a "display device") such as a liquid crystal display device, a gate line (scanning line) is provided for each of pixel lines of a display element (display panel) having a plurality of pixels arranged in lines and columns (in a matrix), and the gate lines are sequentially selected and driven in the cycle of one horizontal period of a display signal, to thereby update a display image. As a gate-line drive circuit (scanning-line drive circuit) for sequentially selecting and driving the pixel lines, that is, the gate lines, there may be adopted a shift register which performs shifting whose one-round operation is made in a one-frame period of the display signal.

Pixels of an imaging element used in an imaging device are also arranged in a matrix, and these pixels are scanned by a gate-line drive circuit to thereby extract data of a captured image. A shift register may be adopted as a gate-line drive circuit of the imaging device, too.

A shift register serving as a gate-line drive circuit includes a plurality of cascade-connected shift register circuits provided for each one of the pixel lines, that is, each one of the gate lines. In this specification, each of the plurality of shift register circuits included in the gate-line drive circuit is called a "unit shift register". Thus, an output terminal of each individual unit shift register included in the gate-line drive circuit is connected to a corresponding gate line, and moreover connected to an input terminal of the next-stage or the subsequent-stage unit shift register.

It is desirable that the shift register used in the gate-line drive circuit is configured with only field effect transistors of the same display device, in order to reduce the number of steps of the manufacturing process for a cost reduction.

The gate-line drive circuit is operated so as to sequentially select the gate lines by transmitting a start pulse inputted the unit shift register of the most preceding stage to the subsequent-stage unit shift registers one after another. The start pulse is a signal (external signal) supplied from the outside of the gate-line drive circuit, and generated by a start pulse generation circuit which is formed on a substrate different from a substrate on which the gate-line drive circuit is formed.

However, an increase in the number of external signals causes an increase in the number of necessary circuits such as a circuit for generating the external signal and a level shifter for adjusting the level of the external signal. This may be a factor in a cost increase of the device. Accordingly, in order to reduce the manufacturing cost of an electro-optical device, it is preferable to reduce the number of external signals as small as possible. For this purpose, there has been made an attempt to reduce the number of external signals by providing the start pulse generation circuit on the same substrate as the gate-line drive circuit is provided to thereby eliminate the need to supply the start pulse from the outside (for example, Japanese Patent Application Laid-Open No. 2006-269002; and Specification of United States Patent Application Publication No. 2008/0122774).

The number of external signals can be reduced, by providing the start pulse generation circuit and the gate-line drive circuit on the same substrate as disclosed in Japanese Patent Application Laid-Open No. 2006-269002 and Specification of United States Patent Application Publication No. 2008/0122774. However, as a matter of course, it is necessary that the area for forming the start pulse generation circuit is ensured on the substrate. From the viewpoint of the manufacturing cost, it is preferable that the substrate has a small area.

SUMMARY OF THE INVENTION

An object of the present invention is to provide a scanning-line drive circuit including only transistors of the same conductivity type and requiring no start pulse generation circuit.

A scanning-line drive circuit according to a first aspect of the present invention is driven by using at least three clock signals of different phases, and includes a plurality of cascade-connected unit shift registers. The plurality of unit shift registers include a specified unit shift register which activates an output signal when two of the three clock signals are both set at an activation level.

A scanning-line drive circuit according to a second aspect of the present invention is driven by using at least three clock signals of different phases, and includes a plurality of cascade-connected unit shift registers. The scanning-line drive circuit is operable to perform a forward-direction shift for shifting a signal from an immediately preceding stage toward a subsequent stage and a reverse-direction shift for shifting a signal from a subsequent stage toward a immediately preceding stage in the plurality of unit shift registers. The plurality of unit shift registers include: a first unit shift register which activates an output signal when two of the three clock signals are both set at an activation level at a time of the forward-direction shift; and a second unit shift register which activates an output signal when two of the three clock signals are both set at the activation level at a time of the reverse-direction shift.

A scanning-line drive circuit according to a third aspect of the present invention is driven by using at least two clock signals of different phases, and including a plurality of cascade-connected unit shift registers. The scanning-line drive circuit is operable to perform a forward-direction shift for shifting a signal from an immediately preceding stage toward a subsequent stage and a reverse-direction shift for shifting a signal from a subsequent stage toward a immediately preceding stage in the plurality of unit shift registers. The scanning-line drive circuit comprises: a first voltage signal terminal to which supplied is a first voltage signal which is set at an activation level at a time of the forward-direction shift and at a deactivation level at a time of the reverse-direction shift; and a second voltage signal terminal to which supplied is a second voltage signal which is set at an activation level at a time of the reverse-direction shift and at a deactivation level at a time of the forward-direction shift. The plurality of unit shift registers include: a first unit shift register which activates an output signal when the first and second voltage signals are both set at an activation level at a time of the forward-direction shift; and a second unit shift register which activates an output signal when the first and second voltage signals are both set at the activation level at a time of the reverse-direction shift.

The scanning-line drive circuit according to the present invention requires no start pulse generation circuit. Therefore, the area of a substrate can be reduced, to contribute to a reduction in the manufacturing cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram of a gate-line drive circuit according to a preferred embodiment 1:

FIG. 3 is a circuit diagram showing an example of a unit shift register;

FIG. 4 is a circuit diagram of a first-stage unit shift register according to the preferred embodiment 1;

FIG. 5 is a diagram showing a circuit configuration of the gate-line drive circuit according to the preferred embodiment 1:

FIG. 6 is a diagram showing the circuit configuration of the gate-line drive circuit according to the preferred embodiment 1;

FIG. 12 is a circuit diagram of an example of a bi-directional unit shift register:

FIG. 13 is a circuit diagram of a first-stage unit shift register according to the preferred embodiment 2;

FIG. 14 is a circuit diagram of a last-stage unit shift register according to the preferred embodiment 2;

FIG. 15 is a circuit diagram of a dummy unit shift register provided in the next stage of the last stage;

FIG. 16 is a circuit diagram of a dummy unit shift register provided in the immediately preceding stage of the first stage:

FIG. 18 is a diagram showing the circuit configuration of the gate-line drive circuit according to the preferred embodiment 2:

FIG. 21 is a block diagram of a gate-line drive circuit according to a modification of the preferred embodiment 2;

FIG. 24 is a diagram showing a circuit configuration of the gate-line drive circuit according to the modification of the preferred embodiment 2;

FIG. 26 is a timing chart showing an operation of the gate-line drive circuit according to the modification of the preferred embodiment 2 at a time of the forward-direction shift;

FIG. 40 is a diagram showing a circuit configuration of the gate-line drive circuit according to the modification of the preferred embodiment 3

FIG. 41 is a diagram showing a circuit configuration of the gate-line drive circuit according to the modification of the preferred embodiment 3;

DESCRIPTION OF THE PREFERRED EMBODIMENTS

Figure 1:
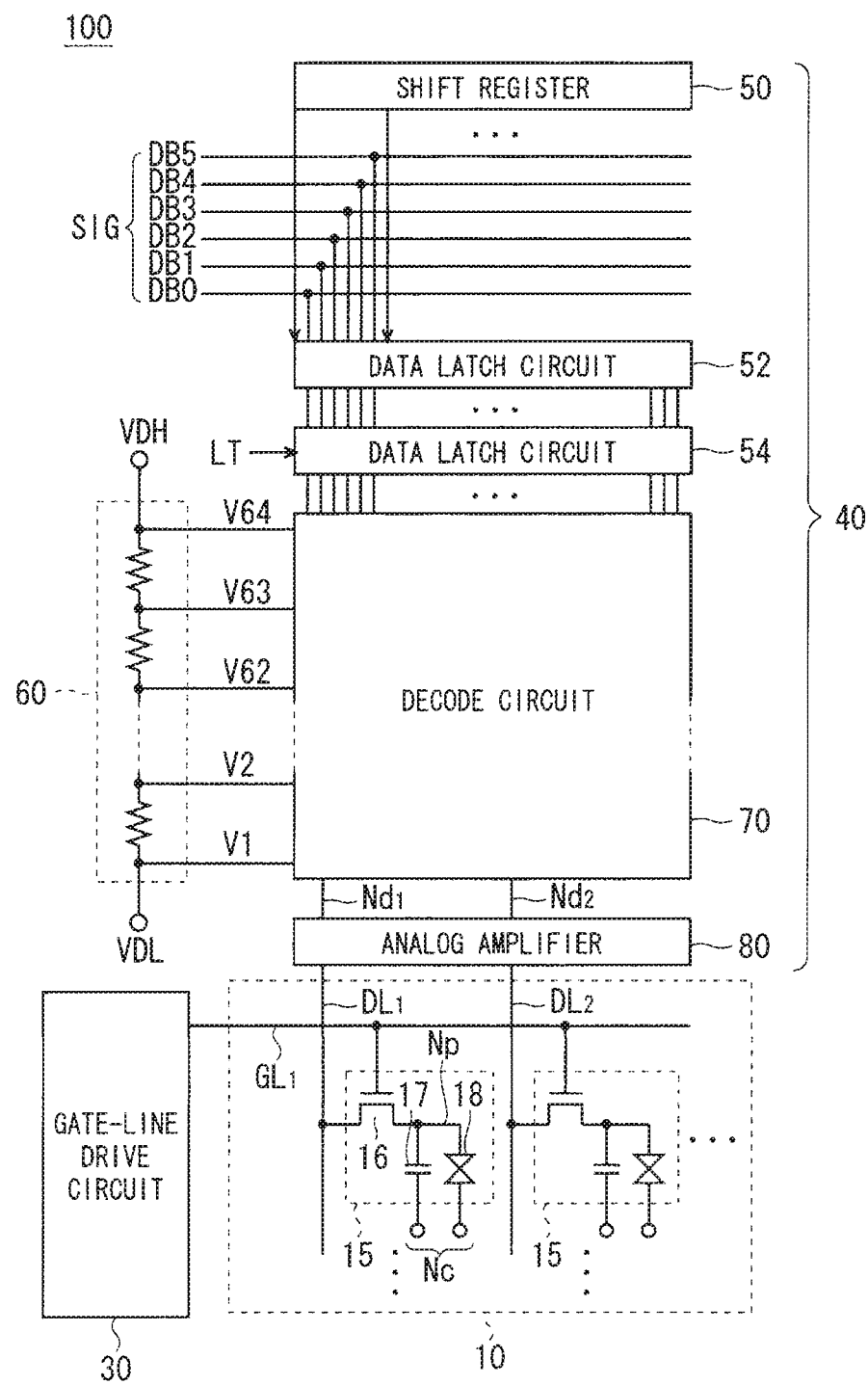
FIG. 1 is a block diagram schematically showing a configuration of a display device which is an example of application of the present invention.

Hereinafter, a preferred embodiment of the present invention will be described with reference to the accompanying drawings. In order to avoid duplicative and thus redundant descriptions, elements having the same or equivalent function are denoted by the same reference sign in the drawings.

A transistor used in each preferred embodiment is an insulated gate type field effect transistor. In the insulated gate type field effect transistor, the electrical conductivity between a drain region and a source region in the semiconductor layer is controlled by an electric field in a gate insulating film. As a material of the semiconductor layer in which the drain region and the source region are formed, an organic semiconductor of polysilicon, amorphous silicon, pentacene or the like, or an oxide semiconductor of single-crystal silicon. IGZO (In—Ga—Zn—O) or the like, can be adopted, for example.

As well known, a transistor is an element having at least three electrodes including a control electrode (a gate (electrode) in a limited sense), one current electrode (a drain (electrode) or a source (electrode) in a limited sense), and the other current electrode (a source (electrode) or a drain (electrode) in a limited sense). The transistor functions as a switching element in which a channel is formed between a drain and a source by application of a predetermined voltage to a gate. The drain and the source of the transistor basically have identical structures, and their nominal designations are exchanged depending on the conditions of a voltage applied. For example, in an N-type transistor, an electrode having a relatively high potential (hereinafter also referred to as a "level") is called a drain while an electrode having relatively low potential is called a source (in a P-type transistor, the reverse applies).

If not otherwise specified, the transistor may be formed on a semiconductor substrate, or may be a thin-film transistor (TFT) formed on an insulating substrate of glass or the like. As a substrate on which the transistor is formed, there may be adopted a single-crystal substrate, or an insulating substrate of SOI, glass, a resin, or the like.

A gate-line drive circuit of the present invention is formed using only transistors of a single conductivity type. For example, an N-type transistor is activated (an ON state, a conducting state) when the voltage between the gate and the source thereof is at the H (high) level which is higher than a threshold voltage of this transistor, and deactivated (an OFF state, a non-conducting state) when the voltage is at the L (low) level which is lower than the threshold voltage. Accordingly, in a circuit using an N-type transistor, the H level of a signal corresponds to an "activation level", and the L level thereof corresponds to a "deactivation level". In the circuit using the N-type transistor, when each node is charged and brought into the H level, a shift from the deactivation level to the activation level occurs, and when the node is discharged and brought into the L level, a shift from the activation level to the deactivation level occurs.

On the other hand, a P-type transistor is activated (an ON state, a conducting state) when the voltage between the gate and the source thereof is at the L level which is lower than a threshold voltage (a negative value based on the source) of the transistor, and deactivated (an OFF state, a non-conducting state) when the voltage is at the H level which is higher than the threshold voltage. Accordingly, in a circuit using a P-type transistor, the L level of a signal corresponds to an "activation level", and the H level thereof corresponds to a "deactivation level". In the circuit using the P-type transistor, the relationship of charging and discharging of each node is opposite to that of the N-type transistor. Thus, when each node is charged and brought into the L level, a shift from the deactivation level to the activation level occurs, and when the node is discharged and brought into the H level, a shift from the activation level to the deactivation level occurs.

In this specification, the shift from the deactivation level to the activation level is defined as a "pull-up", and the shift from the activation level to the deactivation level is defined as "pull-down". That is, in the circuit using the N-type transistor, the shift from the L level to the H level is defined as "pull-up" and the shift from the H level to the L level is defined as "pull-down", whereas in the circuit using the P-type transistor, the shift from the H level to the L level is defined as "pull-up" and the shift from the L level to the H level is defined as "pull-down".

Moreover, in this specification, a description is based on the assumption that "connection" between two elements, between two nodes, or between one element and one node includes a state equivalent to substantially direct connection, though the connection is made through another component (such as an element or a switch). For example, even in a case where two elements are connected via a switch, the relationship between the two elements is described as "connection" if they can function in the same manner as when they are directly connected to each other.

In the present invention, clock signals (multi-phase clock signals) having different phases are used. In the following, for easy description, a certain interval is provided between an activation period of one clock signal and an activation period of a clock signal which is activated next to the one clock signal (for example, from the time $t_1$ to the time $t_2$ in FIG. 8). However, in the present invention, it suffices that the activation periods of the respective clock signals do substantially not overlap one another, and thus the interval may not necessarily be provided. For example, when the H level corresponds to the activation level, a fall timing (a shift from the H level to the L level) of one clock signal may be concurrent with a rise timing (a shift from the L level to the H level).

Preferred Embodiment 1

FIG. 1 is a block diagram schematically showing a configuration of a display device according to the present invention. FIG. 1 shows an overall configuration of a liquid crystal display device as a typical example of the display device. Application of the present invention is not limited to the liquid crystal display device, and the present invention can be widely applied to electro-optical devices including a display device which converts an electrical signal into a light brightness, as exemplified by an electro-luminescence (EL), an organic EL, a plasma display, and an electronic paper, and an imaging device (image sensor) which converts a light intensity into an electrical signal.

A liquid crystal display device 100 includes a liquid crystal array section 10, a gate-line drive circuit (scanning-line drive circuit) 30, and a source driver 40. A shift register according to a preferred embodiment of the present invention is mounted in the gate-line drive circuit 30, which will be clearly described later.

The liquid crystal array section 10 includes a plurality of pixels 15 arranged in lines and columns. Gate lines $GL_1$, $GL_2$ . . . (collectively called "gate lines GL") are arranged in the respective lines of pixels (hereinafter also referred to as "pixel lines"). Data lines $DL_1$, $DL_2$ . . . (collectively called "data lines DL") are arranged in the respective columns of pixels (hereinafter also referred to as "pixel columns"). In FIG. 1, the pixel 15 in the first line and the first column, the pixel 15 in the first line and the second column, and the gate line $GL_1$ and the data lines $DL_1$, $DL_2$ corresponding to these pixels 15 are shown as a representative.

Each pixel 15 has a pixel switching element 16 provided between the corresponding data line DL and a pixel node Np, and a capacitor 17 and a liquid crystal display element 18 connected in parallel with each other between the pixel node Np and a common electrode node Nc. The liquid crystal orientation in the liquid crystal display element 18 changes depending on a voltage difference between the pixel node Np and the common electrode node Nc. In response to this change, the display brightness of the liquid crystal display element 18 changes. Thereby, the brightness of each pixel can be controlled by a display voltage transmitted to the pixel node Np via the data line DL and the pixel switching element 16. That is, an intermediate voltage difference located between the voltage difference corresponding to the maximum brightness and the voltage difference corresponding to the minimum brightness is applied to between the pixel node Np and the common electrode node Nc, thereby obtaining an intermediate brightness. Accordingly, gradational brightnesses can be obtained by setting the display voltage in stages.

The gate-line drive circuit 30 sequentially selects and drives the gate lines GL, based on a predetermined scanning cycle. A gate electrode of the pixel switching element 16 is connected to the corresponding gate line GL. While a particular gate line GL is selected, the pixel switching element 16 of each of the pixels connected to this gate line GL is in the conducting state, so that the pixel node Np is connected to the corresponding data line DL. Thus, the display voltage transmitted to the pixel node Np is held by the capacitor 17. In general, the pixel switching element 16 is configured as a TFT formed on the same insulation substrate (such as a glass substrate and a resin substrate) as the liquid crystal display element 18 is formed on.

The source driver 40 serves to output the display voltage to the data line DL. The display voltage is set in stages by a display signal SIG which is an N-bit digital signal. Here, in an example, it is assumed that the display signal SIG is a 6-bit signal, and includes display signal bits DB0 to DB5. Based on the 6-bit display signal SIG, a gradation display in $2^6=64$ stages is allowed in each pixel. Moreover, if one color display unit is formed with three pixels of R (Red), G (Green), and B (Blue), about 260,000 colors can be displayed.

As shown in FIG. 1, the source driver 40 includes a shift register 50, a data latch circuits 52, 54, a gradation voltage generation circuit 60, a decode circuit 70, and an analog amplifier 80.

In the display signal SIG, the display signal bits DB0 to DB5 corresponding to the display brightness of each pixel 15 are serially generated. That is, the display signal bits DB0 to DB5 at each timing indicate the display brightness of any one of the pixels 15 in the liquid crystal array section 10.

The shift register 50 instructs the data latch circuit 52 to load the display signal bits DB0 to DB5 at a timing synchronized with a cycle of switching the setting of the display signal SIG. The data latch circuit 52 sequentially loads the display signals SIG which are serially generated, and holds the display signals SIG for one pixel line.

A latch signal LT inputted to the data latch circuit 54 is activated at a timing when the display signals SIG for one pixel line are loaded in the data latch circuit 52. In response thereto, the data latch circuit 54 loads the display signals SIG for one pixel line which are held in the data latch circuit 52.

The gradation voltage generation circuit 60 includes sixty-three voltage dividing resistors connected in series with one another between a high voltage VDH and a low voltage VDL. The gradation voltage generation circuit 60 generates 64-stage gradation voltages V1 to V64.

The decode circuit 70 decodes the display signal SIG held in the data latch circuit 54, and based on a result of the decoding, selects a voltage from the gradation voltages V1 to V64 and outputs the selected voltage to each of decode output nodes $Nd_1$, $Nd_2$ . . . (collectively called "decode output nodes Nd").

As a result, a display voltage (one of the gradation voltages V1 to V64) corresponding to each of the display signals SIG for one pixel line held in the data latch circuit 54 are outputted to the decode output nodes Nd simultaneously (in parallel). In FIG. 1, the decode output nodes $Nd_1$, $Nd_2$ corresponding to the data lines $DL_1$, $DL_2$ of the first and second columns are shown as a representative.

The analog amplifier 80 amplifies a current of an analog voltage corresponding to the display voltage outputted from the decode circuit 70 to each of the decode output nodes $Nd_1$, $Nd_2$ . . . and outputs it to each of the data lines $DL_1$, $DL_2$ . . . .

Based on the predetermined scanning cycle, the source driver 40 repeatedly outputs, to the data lines DL, the display voltages corresponding to a series of display signals SIG on one-pixel-line basis. The gate-line drive circuit 30 sequentially drives the gate lines $GL_1$, $GL_2$ . . . in synchronization with the scanning cycle. Thereby, an image display based on the display signals SIG is made in the liquid crystal array section 10.

Although in the liquid crystal display device 100 illustrated in FIG. 1, the gate-line drive circuit 30 and the source driver 40 are integrally configured with the liquid crystal array section 10, it may also be acceptable that the gate-line drive circuit 30 and the liquid crystal array section 10 are integrally configured while the source driver 40 is provided as an external circuit of the liquid crystal array section 10, or that the gate-line drive circuit 30 and the source driver 40 are provided as external circuits of the liquid crystal array section 10.

FIG. 2 is a block diagram showing a configuration of the gate-line drive circuit 30. The gate-line drive circuit 30 is configured as a multi-stage shift register including a plurality of (n) unit shift registers $SR_1$, $SR_2$, $SR_3$, $SR_4$, . . . , $SR_n$ which are cascade-connected with one another (for convenience of the description, the cascade-connected shift register circuits $SR_1$, $SR_2$ . . . are collectively referred to as "unit shift registers SR"). Each of the unit shift registers SR is provided for one pixel line, that is, for one gate line GL.

In the gate-line drive circuit 30 according to this preferred embodiment, all of the unit shift registers $SR_2$ to $SR_n$ of the second to n-th (last) stages have the identical configurations each having an input terminal IN, an output terminal OUT, a clock terminal CK, and a reset terminal RST. The unit shift register SR₁ of the first stage (most preceding stage) has two input terminals, unlike the other stages. That is, the unit shift register SR₁ has first and second input terminals IN1, IN2, the output terminal OUT, the clock terminal CK, and the reset terminal RST.

The output terminal OUT of each unit shift register SR is connected to each corresponding gate line GL. Thus, an output signal G of each unit shift register SR is, as a vertical (or horizontal) scanning pulse, outputted to the gate line GL.

A clock generator 31 inputs three-phase clock signals CLK1, CLK2, CLK3 having different phases (having their activation periods not overlapping one another), to the unit shift register SR of the gate-line drive circuit 30. The clock signals CLK1, CLK2, CLK3 are controlled so as to be sequentially and repeatedly activated (in the order of CLK1, CLK2, CLK3, CLK1, . . . ) at timings synchronized with the scanning cycle of the display device (see FIG. 7).

As shown in FIG. 2, any one of the clock signals CLK1 to CLK3 is supplied to the clock terminal CK of each unit shift register SR.

More specifically, the clock signal CLK1 is supplied to the unit shift registers SR₁, SR₄, SR₇ . . . which drive the gate lines $GL_{3m-2}$ of the (3m−2)th line (m is a natural number: hereinafter the same is true). The clock signal CLK2 is supplied to the unit shift registers SR₂, SR₅, SR₈ . . . which drive the gate lines $GL_{3m-1}$ of the (3m−1)th line. The clock signal CLK3 is supplied to the unit shift registers SR₃, SR₆, SR₉ . . . which drive the gate lines $GL_{3m}$ of the (3m)th line. Since the clock signals CLK1, CLK2, CLK3 are repeatedly activated in this order, the clock terminals CK of the shift registers SR₁, SR₂, SR₃ . . . are activated in this order.

Here, in general, the number of scanning lines of the display device is not a factor of three. Therefore, in the shift register controlled by the three-phase clock signals CLK1 to CLK3, the clock signal supplied to the clock terminal CK of the unit shift register SR_n of the n-th stage which is the last line is changed depending on the number of scanning lines of the display device. In an example shown in FIG. 2, the clock signal CLK1 is supplied to the clock terminal CK of the unit shift register SR_n.

Clock signals inputted respectively to the first and second input terminals IN1, IN2 of the unit shift register SR₁ of the first stage have their phases different from each other and also different from the clock signal CLK1 which is inputted to the clock terminal CK. Here, the clock signal CLK2 is inputted to the first input terminal IN1, and the clock signal CLK3 is inputted to the second input terminal IN2. In the unit shift registers SR of the second and subsequent stages, inputted to the input terminal IN is the output signal G of the immediately preceding stage.

Inputted to the reset terminal RST of each unit shift register SR is the output signal G of the next stage. However, in the unit shift register SR_n of the last stage, inputted to the reset terminal RST is the clock signal CLK2 which will be activated next to the clock signal CLK1 inputted to the clock terminal CK.

In synchronization with the clock signals CLK1 to CLK3, each unit shift register SR of the gate-line drive circuit 30 time-shifts the output signal G of the immediately preceding stage, and transmits the resultant signal to the corresponding gate line GL and the next-stage unit shift register SR. Consequently, the output signals G of the respective unit shift registers SR are sequentially activated in the order of G₁, G₂, G₃ . . . (details of the operation of the unit shift register SR will be described later). Thus, a series of the unit shift registers SR functions as a so-called gate line drive unit which sequentially activates the gate lines GL at timings based on the predetermined scanning cycle.

In the conventional gate-line drive circuit 30, in order to activate the output signal G₁ of the unit shift register SR₁ of the first stage, a start pulse is supplied from the outside to the input terminal IN of the unit shift register SR₁. However, as seen from FIG. 2, no start pulse is supplied to the unit shift register SR₁ of this preferred embodiment.

In the following, a circuit configuration of each unit shift register SR will be described. Firstly, a configuration of each of the unit shift registers SR of the second and subsequent stages will be described. FIG. 3 is a circuit diagram thereof. In the gate-line drive circuit 30, all the unit shift registers SR₂ to SR_n have substantially identical configurations. Thus, a configuration of the unit shift register SR_k of the k-th stage (2≤k≤n) will be described as a representative. All of transistors included in this unit shift register SR_k are field effect transistors of the same conductivity type, and N-type TFTs are adopted here.

As shown in FIG. 3, the unit shift register SR_k has not only the input terminal IN, the output terminal OUT, the clock terminal CK, and the reset terminal RST which are shown in FIG. 2, but also a first power supply terminal S1 and a second power supply terminal S2 to which a low-potential-side power supply potential (low-side power supply potential) VSS and a high-potential-side power supply potential (high-side power supply potential) VDD are supplied, respectively. In the following description, the low-side power supply potential VSS serves as a reference potential of the circuit (VSS=0), but in an actual use, the reference potential is set based on the voltage of data written into a pixel. For example, the high-side power supply potential VDD is set to 17V, and the low-side power supply potential VSS is set to −12V.

An output stage of the unit shift register SR_k includes a transistor Q1 (output pull-up transistor) which brings the output signal G_k into the activation level (H level) while the gate line GL_k is selected, and a transistor Q2 (output pull-down transistor) which keeps the output signal G_k at the deactivation level (L level) while the gate line GL_k is not selected.

The transistor Q1 is connected between the output terminal OUT and the clock terminal CK, and activates the output signal G_k by supplying the clock signal inputted to the clock terminal CK, to the output terminal OUT. The transistor Q2 is connected between the output terminal OUT and the first power supply terminal S1, and keeps the output signal G_k at the deactivation level by discharging the output terminal OUT into the potential VSS. Here, a node connected to the gate (control electrode) of the transistor Q1 is defined as a "node N1", and a node connected to the gate of the transistor Q2 is defined as a "node N2".

A capacitance element C1 (boost capacitance) is connected between the gate and the source of the transistor Q1 (that is, between the output terminal OUT and the node N1). This capacitor element C1 capacitively couples the output terminal OUT with the node N1 to enhance a boost effect of the node N1 which is involved in the rise in level of the output terminal OUT.

A transistor Q3 is connected between the node N and the second power supply terminal S2, and the gate of the transistor Q3 is connected to the input terminal IN. The transistor Q3 functions so as to charge the node N1 in accordance with the activation of a signal (input signal) supplied to the input terminal IN.

A transistor Q4 having its gate connected to the reset terminal RST is connected between the node N1 and the first power supply terminal S1. The transistor Q4 functions so as to discharge the node N1 in accordance with the activation of a signal (reset signal) supplied to the reset terminal RST. A transistor Q5 having its gate connected to the node N2 is also connected between the node N1 and the first power supply terminal S1. The transistor Q5 functions so as to discharge the node N1 to keep the node N1 at the deactivation level (L level) while the node N2 is at the activation level (H level).

A circuit including these transistors Q3, Q4, Q5 forms a "pull-up drive circuit" which drives the transistor Q1 (output pull-up transistor) by charging and discharging the node N1.

A transistor Q6 having its gate connected to the second power supply terminal S2 is connected between the node N2 and the second power supply terminal S2 (that is, the transistor Q6 is diode-connected). A transistor Q7 having its gate connected to the node N1 is connected between the node N2 and the first power supply terminal S1.

The transistor Q7 is set such that its on-resistance can be sufficiently small (that is, its drive capability can be high) as compared with the transistor Q6. Therefore, when the gate (node N1) of the transistor Q7 is brought into the H level so that the transistor Q7 is turned on, the node N2 is discharged to the L level, whereas when the node N1 is brought into the L level so that the transistor Q7 is turned off, the node N2 is brought into the H level. That is, the transistors Q6, Q7 form a ratio-type inverter whose input and output ends are the nodes N1 and N2, respectively. In this inverter, the transistor Q6 functions as a load element, and the transistor Q7 functions as a drive element.

This inverter forms a "pull-down drive circuit" which drives the transistor Q2 (output pull-down transistor) by charging and discharging the node N2.

Next, a configuration of the unit shift register $SR_1$ will be described. FIG. 4 is a circuit diagram thereof. As shown in FIG. 4, the unit shift register $SR_1$ is obtained by replacing the transistor Q3 included in the circuit of FIG. 3 with two transistors Q31, Q32 (charge circuit) connected in series with each other. A node connected between the transistors Q31, Q32 is defined as a "node N3".

The transistor Q31 is connected between the second power supply terminal S2 and the node N3, and the gate thereof is connected to the first input terminal IN1. The transistor Q32 is connected between the node N1 and the node N3, and the gate thereof is connected to the second input terminal IN2. The other parts of the circuit configuration of the unit shift register $SR_1$ are the same as those of the unit shift register $SR_k$ of FIG. 3.

FIGS. 5 and 6 are diagrams showing a specific circuit configuration of the gate-line drive circuit 30. FIG. 5 shows the relationship of connection of the unit shift registers $SR_1$, $SR_2$ of the most preceding two stages. FIG. 6 shows the relationship of connection of the unit shift registers $SR_{n-1}$, $SR_n$ of the last two stages.

Figure 7:
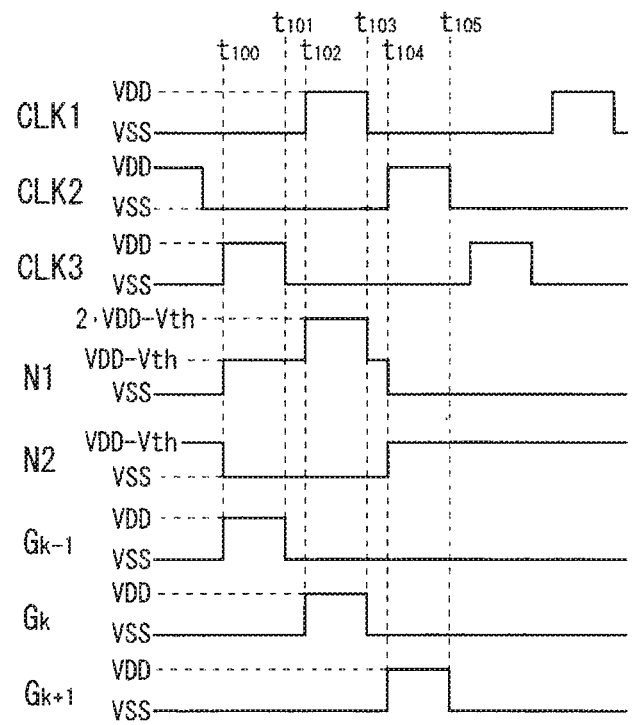
FIG. 7 is a timing chart showing an operation of the unit shift register of FIG. 3.

Next, an operation of the unit shift register $SR_k$ of FIG. 3 will be described. FIG. 7 is a signal waveform diagram showing the operation. Here, the description will be given based on the assumption that the clock signal CLK1 is inputted to the clock terminal CK of the unit shift register $SR_k$ (for example, the unit shift register $SR_4$ of FIG. 2 correspond thereto).

For an easy description, if not otherwise specified, the following description is based on the assumption that: the H-level potentials of the clock signals CLK1 to CLK3 are equal to the high-side power supply potential VDD; the L-level potentials of the clock signals CLK1 to CLK3 are equal to the low-side power supply potential VSS, and this potential is 0V (VSS=0); and all of the threshold voltages of the respective transistors are equal, and the value thereof is Vth. The clock signals CLK1 to CLK3 are repetitive signals phase-shifted from one another by one horizontal period (1H).

Firstly, it is assumed that in an initial state of the unit shift register $SR_k$, the node N1 is at the L level and the node N2 is at the H level. At this time, the transistor Q1 is OFF (in a blocked state), and the transistor Q2 is ON (in the conducting state). Therefore, the output terminal OUT (output signal $G_k$) is kept at the L level, irrespective of the level of the clock terminal CK (clock signal CLK1) (hereinafter, this state will be referred to as a "reset state"). That is, the gate line GLk to which the unit shift register $SR_k$ is connected is in an unselected state. It is assumed that in the initial state, the clock signals CLK1 to CLK3, and the output signal ($G_{k-1}$ of its immediately preceding stage (unit shift register $SR_{k-1}$) are all at the L level.

When, from this state, the output signal $G_{k-1}$ of the immediately preceding stage is brought into the H level along with the rise of the clock signal CLK3 at the time $t_{100}$, the transistor Q3 of this unit shift register $SR_k$ is turned ON. At this time, the node N2 is at the H level, and thus the transistor Q5 is ON. Since the transistor Q3 has its on-resistance sufficiently small (the drive capability is sufficiently high) as compared with the transistor Q5, the level of the node N1 rises.

Thereby, the transistor Q7 starts conducting, and the level of the node N2 drops. This increases a resistance value of the transistor Q5, and therefore the level of the node N1 rapidly rises, so that the transistor Q7 becomes sufficiently ON. As a result, the node N2 becomes the L level (VSS). Accordingly, the transistor Q5 is turned OFF, to bring the node N1 into the H level (VDD−Vth).

When the node N1 becomes the H level and the node N2 becomes the L level in this manner, the transistor Q1 is turned ON and the transistor Q2 is turned OFF (hereinafter, this state will be referred to as a "set state". However, at this time point, the clock signal CLK1 is at the L level, and therefore the output signal $G_k$ is kept at the L level.

When, at the time $t_{101}$, the output signal $G_{k-1}$ of the immediately preceding stage returns to the L level along with the fall of the clock signal CLK3, the transistor Q3 is turned OFF. However, the transistors Q4, Q5 are also in the OFF state, and therefore the node N1 is kept at the H level in a high impedance state (floating state).

Then, when the clock signal CLK1 rises to the H level at the time $t_{102}$, the rise of the level is transmitted to the output terminal OUT through the ON-state transistor Q1, so that the level of the output signal $G_k$ rises. At this time, because of the coupling through the capacitance element C1 and a gate capacitance (a capacitance between the gate and the source, a capacitance between the gate and the drain, and a capacitance between the gate and the channel) of the transistor Q1, the potential of the node N1 is boosted in accordance with the rise of the level of the output signal $G_k$. Therefore, even when the level of the output terminal OUT rises, the voltage between the gate and the source of the transistor Q1 is kept higher than the threshold voltage (Vth), and the transistor Q1 is kept at a low impedance.

Accordingly, the output signal $G_k$ quickly becomes the H level following the rise of the clock signal CLK. At this time, the transistor Q1 is operated in a non-saturated region to charge the output terminal OUT. Therefore, the level of the output signal $G_k$ rises to the same potential VDD as that of the clock signal CLK1, not involving a loss corresponding to the threshold voltage of the transistor Q1.

In this manner, when the output signal $G_k$ becomes the H level, the gate line GLk is in a selected state. Since the output signal $G_k$ is supplied also to the input terminal IN of the next-stage unit shift register $SR_{k+1}$, the next-stage unit shift register $SR_{k+1}$ is brought into the set state.

Then, when the clock signal CLK1 falls and returns to the L level at the time $t_{103}$, the output terminal OUT is discharged by the ON-state transistor Q1. Thus, the output signal $G_k$ becomes the L level (VSS) and the gate line $GL_k$ returns to the unselected state. At this time, the node N1 returns to the pre-boosting potential (VDD−Vth).

Then, when the clock signal CLK2 rises to the H level at the time $t_{104}$, the next-stage output signal $G_{k+1}$ becomes the H level. Thus, in the unit shift register $SR_k$, the transistor Q4 is turned ON to bring the node N1 into the L level. Accordingly, the transistor Q7 is turned OFF, to bring the node N2 into the H level. That is, the unit shift register $SR_k$ returns to the reset state in which the transistor Q1 is OFF and the transistor Q2 is ON. At this time, the transistor Q5 is turned ON.

When the next-stage output signal $G_{k+1}$ falls at the time $t_{105}$, the transistor Q4 is turned OFF. However, the transistor Q5 is kept ON, and therefore the node N1 is kept at the L level with a low impedance.

After the time $t_{105}$, until the output signal $G_{k-1}$ of the immediately preceding stage is activated in the next frame period, a half latch circuit including the transistors Q5 to Q7 keeps the node N1 at the L level and the node N2 at the H level, so that the unit shift register $SR_k$ is kept in the reset state. Therefore, while the gate line $GL_k$ is not selected, the output signal $G_k$ is kept at the L level with a low impedance.

As described above, the second or subsequent unit shift register $SR_k$ is brought into the set state in accordance with activation of the signal (the output signal $G_{k-1}$ of the immediately preceding stage) of the input terminal IN, and activates the output signal $G_k$ in an activation period of the signal (clock signal CLK1) of the next clock terminal CK. Then, the unit shift register $SR_k$ returns to the reset state in accordance with activation of the signal (the next-stage output signal $G_{k+1}$ (the clock signal CLK2 in the unit shift register $SR_n$) of the reset terminal RST, and subsequently keeps the output signal $G_k$ at the L level.

Figure 8:
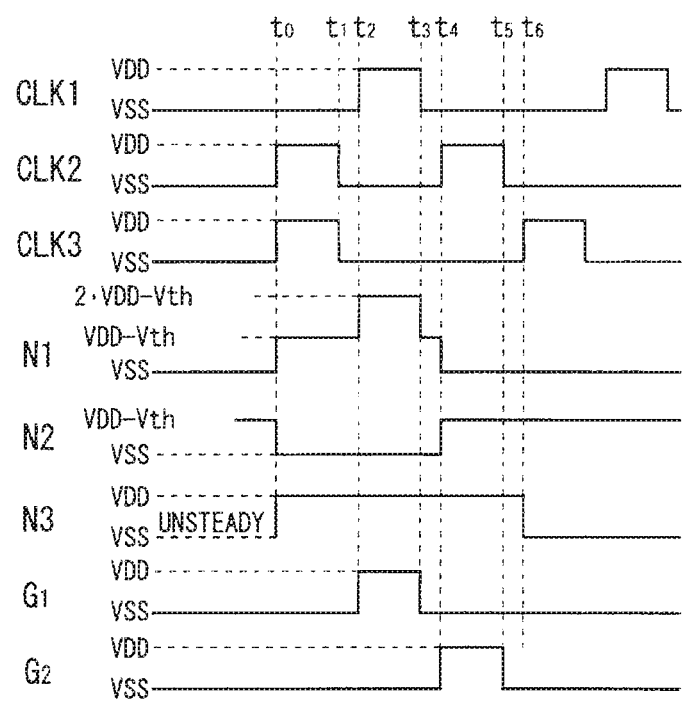
FIG. 8 is a timing chart showing an operation of a unit shift register according to the preferred embodiment 1.

Next, an operation of the unit shift register $SR_1$ of the first stage shown in FIG. 4 will be described. FIG. 8 is a signal waveform diagram showing the operation. As described above, in the unit shift register $SR_1$, the clock signal CLK1 is inputted to the clock terminal CK, the clock signal CLK2 is inputted to the first input terminal IN1, and the clock signal CLK3 is inputted to the input terminal IN3.

During a normal operation of the gate-line drive circuit 30, the clock signal generator 31 makes such a control that the activation periods of the clock signals CLK1 to CLK3 cannot overlap each other. However, at a timing when a shift operation is started on a signal of the gate-line drive circuit 30, in other words, at a timing corresponding to the beginning of a frame period, the clock signals CLK2, CLK3 are exceptionally activated simultaneously.

Firstly, the reset state in which the node N1 is at the L level and the node N2 is at the H level is assumed as an initial state of the unit shift register $SR_1$. At this time, the transistor Q1 is OFF and the transistor Q2 is ON. Therefore, the output terminal OUT (output signal $G_1$) is kept at the L level irrespective of the level of the clock terminal CK (clock signal CLK1). It is also assumed that the clock signals CLK1 to CLK3 are all at the L level in the initial state. Thus, both of the transistors Q31, Q32 are OFF, and the level of the node N3 is not steady.

At the time $t_0$ corresponding to the beginning of the frame period, both of the clock signals CLK2, CLK3 are activated. This causes both of the transistors Q31, Q32 to be turned ON. At this time, the node N2 is at the H level, and therefore the transistor Q5 is also ON. Here, since the total on-resistance of the transistors Q31, Q32 is set sufficiently smaller than the on-resistance of the transistor Q5. Therefore, the node N1 is at the H level. Accordingly, the transistor Q7 is turned ON, and the node N2 is at the L level (VSS). At this time, the transistor Q5 is OFF, to cause the potential of the node N1 to rise to VDD-Vth.

As a result, the unit shift register $SR_1$ is brought into the set state in which the node N1 is at the H level and the node N2 is at the L level, so that the transistor Q1 is turned ON and the transistor Q2 is turned OFF. However, at this time point, the clock signal CLK1 is at the L level, and therefore the output signal $G_1$ is kept at the L level.

Subsequently, at the time $t_1$, the clock signals CLK2, CLK3 return to the L level. Accordingly, the transistors Q31, Q32 are turned OFF. Here, the transistors Q4, Q5 are also in the OFF state, and thus the node N1 is kept at the H level with a high impedance. The node N3 is also at the H level (VDD-Vth) with a high impedance.

When the clock signal CLK1 becomes the H level at the time $t_2$, the rise of the level is transmitted to the output terminal OUT through the ON-state transistor Q1, so that to bring the output signal $G_1$ into the H level. At this time, because of the coupling through the capacitance element C1 and a gate capacitance (a capacitance between the gate and the source, a capacitance between the gate and the drain, and a capacitance between the gate and the channel) of the transistor Q1, the potential of the node N1 is boosted, and the transistor Q1 is kept at a low impedance. Accordingly, following the rise of the clock signal CLK, the output signal $G_1$ is quickly brought into the H level. At this time, the transistor Q1 is operated in a non-saturated region, so that the H-level potential of the output signal $G_1$ is VDD.

In this manner, when the output signal $G_1$ becomes the H level, the gate line $GL_1$ is selected. Since the output signal $G_1$ is supplied to the input terminal IN of the second-stage unit shift register $SR_2$, the unit shift register $SR_2$ is brought into the set state.

Then, when the clock signal CLK1 returns to the L level at the time $t_3$, the output terminal OUT is discharged by the ON-state transistor Q1. This brings the output signal $G_1$ into the L level (VSS), and the gate line $GL_1$ returns to the unselected state. At this time, the node N1 returns to the pre-boosting potential (VDD−Vth).

When the clock signal CLK2 becomes the H level at the time $t_4$, the second-stage output signal $G_2$ is brought into the H level. This causes the transistor Q4 to be turned ON in the unit shift register $SR_1$. At this time, the gate of the transistor Q31 becomes the H level (VDD). However, the transistor Q32 is OFF, and therefore a current does not flow to the node N1 through the transistors Q31, Q32. Thus, the node N1 is at the L level. Accordingly, the transistor Q7 is turned OFF, to bring the node N2 into the H level. That is, the unit shift register $SR_1$ returns to the reset state in which the transistor Q1 is OFF and the transistor Q2 is ON. At this time, the transistor Q5 is turned ON.

When the second-stage output signal $G_2$ falls with the clock signal CLK2 at the time $t_5$, the transistor Q4 is turned OFF. However, the transistor Q5 is kept ON, and therefore the node N1 is kept at the L level with a low impedance. The node N3 remains at the H level (VDD-Vth) with a high impedance at the time $t_5$, but when the clock signal CLK3 becomes the H level at the time $t_6$, the node N3 is discharged through the transistors Q32, Q5 into the L level (VSS).

After the time $t_6$, until both of the clock signals CLK2, CLK3 are activated at the beginning of the next frame period, the half latch circuit including the transistors Q5 to Q7 keeps the node N1 at the L level and the node N2 at the H level, so that the unit shift register $SR_1$ is kept in the reset state. Therefore, while the gate line $GL_k$ is not selected, the output signal $G_k$ is kept at the L level with a low impedance. Thus, while the gate line $GL_1$ is not selected, the output signal $G_1$ is kept at the L level with a low impedance.

As described above, except the operation at a time of shifting to the set state, the operation of the unit shift register $SR_1$ is the same as the operation of the second or subsequent unit shift register $SR_k$ described above. That is, the unit shift register $SR_1$ is brought into the set state in accordance with simultaneous activation of the signals (clock signals CLK2, CLK3) of the first and second input terminals IN1, IN2, and activates the output signal $G_1$ in the activation period of the signal (clock signal CLK1) of the next clock terminal CK. Then, the unit shift register $SR_1$ returns to the reset state in accordance with activation of the signal (the second-stage output signal $G_2$) of the reset terminal RST, and subsequently keeps the output signal $G_1$ at the L level.

In this manner, the unit shift register $SR_1$ can activate the output signal $G_1$ by overlapping the activation periods of the clock signals CLK2, CLK3, without using a start pulse.

Figure 9:
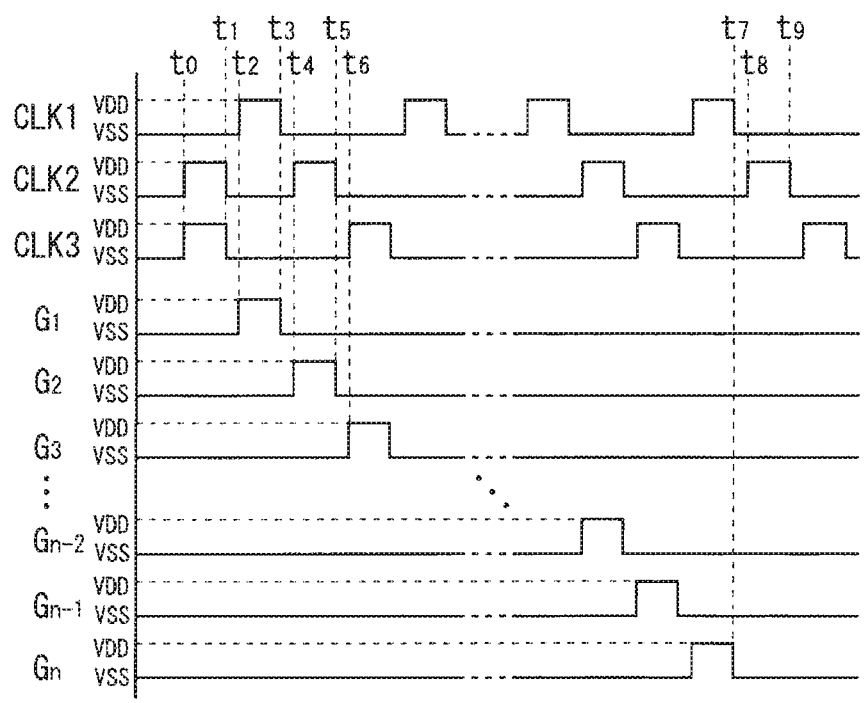
FIG. 9 is a timing chart showing an operation of the gate-line drive circuit according to the preferred embodiment 1.

Accordingly, in the gate-line drive circuit 30 in which the unit shift registers $SR_1$ to $SR_n$ are cascade-connected with one another, as shown in FIG. 9, triggered by simultaneous activation of the clock signals CLK2, CLK3, the output signals $G_1$, $G_2$, $G_3$, ... $G_n$ are sequentially activated at timings synchronized with the clock signals CLK1 to CLK3. Thereby, the gate-line drive circuit 30 can sequentially drive the gate lines $GL_1$, $GL_2$, $GL_3$, ... in a predetermined scanning cycle. In the gate-line drive circuit 30 of this preferred embodiment, since a start pulse generation circuit is not required, the area of the substrate can be reduced, which contributes to a reduction in the manufacturing cost.

The times $t_0$ to $t_6$ of FIG. 9 correspond to those shown in FIG. 8, respectively. The time $t_7$ of FIG. 9 indicates the time of expiration of the activation period of the output signal $G_n$ of the last stage (unit shift register $SR_n$). A time period from the time $t_7$ to the time $t_0$ of the next frame is a "blanking period". A time period from the time $t_8$ to the time $t_9$ indicates the activation period of the clock signal CLK2 following the time $t_7$. In this preferred embodiment, the clock signal CLK2 is inputted to the reset terminal RST of the unit shift register $SR_n$. Therefore, at the time $t_8$, the unit shift register $SR_n$ shifts from the set state to the reset state.

In this manner, in this preferred embodiment, the unit shift register $SR_n$ is brought into the reset state by using the clock signal CLK2. However, for example, a dummy unit shift register may be provided in the further next-stage of the unit shift register $SR_n$, and its output signal (whose activation period is from the time $t_8$ to the time $t_9$) may be supplied to the reset terminal RST of the unit shift register $SR_n$.

In an example shown in this preferred embodiment, the unit shift register $SR_k$ is operated by using the three-phase clock signals CLK to CLK3. However, the unit shift register $SR_k$ can also be operated by using clock signals of four or more phases.

Modification

Here, a modification of the unit shift register $SR_1$ of the first stage will be shown.

Figure 10A:
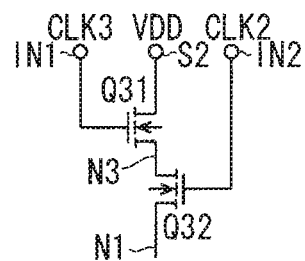
FIGS. 10A, 10B, and 10C are diagrams for explaining a modification of the preferred embodiment 1.

In the unit shift register $SR_1$ of FIG. 3, the clock signal CLK2 and the clock signal CLK3 are inputted to the first input terminal IN1 (the gate of the transistor Q31) and the second input terminal IN2 (the gate of the transistor Q32), respectively. However, as shown in FIG. 10A, they may be exchanged so that the clock signal CLK3 and the clock signal CLK2 are inputted to the first input terminal IN1 and the second input terminal IN2, respectively. In this case, a timing of discharging the node N3 is the time $t_4$ of FIG. 8. This difference does not influence the operation of the unit shift register $SR_1$ activating the output signal $G_1$.

Figure 10B:
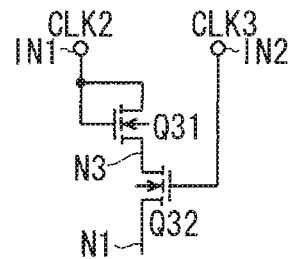

In the unit shift register $SR_1$ of FIG. 4, the drain of the transistor Q31 is connected to the second power supply terminal S2. However, as shown in FIG. 10B, the drain of the transistor Q31 may be connected to the first input terminal IN1 (that is, the transistor Q31 may be diode-connected). The drain of the transistor Q31 may be connected to the second input terminal IN2, though not shown.

Figure 10C:
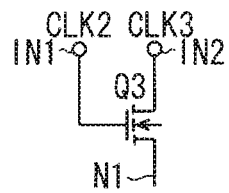

The transistors Q31, Q32 of the unit shift register $SR_1$ of FIG. 4 may be replaced with a single transistor Q3 shown in FIG. 10C. The transistor Q3 is connected between the node N1 and the second input terminal IN2 (clock signal CLK3), and the gate thereof is connected to the first input terminal IN1 (clock signal CLK2).

In this case, however, it is necessary that, after both of the clock signals CLK2, CLK3 are activated to charge the node N1 of the unit shift register $SR_1$, the clock signal CLK3 is deactivated simultaneously with or later than the clock signal CLK2. This is because if the clock signal CLK3 reaches the deactivation level earlier than the clock signal CLK2, the node N1 is discharged through the transistor Q3.

In the transistor Q3 of FIG. 10C, the clock signals CLK2, CLK3 may be exchanged. In this case, after both of the clock signals CLK2, CLK3 are activated to charge the node N of the unit shift register $SR_1$, the clock signal CLK2 is deactivated simultaneously or later than the clock signal CLK3.

Preferred Embodiment 2

In a preferred embodiment 2, the present invention is applied to a shift register in which a signal shift direction is changeable. The gate-line drive circuit 30 configured with such a shift register is capable of bi-directional scanning. Here, an operation for shifting a signal in a direction from the immediately preceding stage to the subsequent stage (in the order of unit shift registers $SR_1$, $SR_2$, $SR_3$, ... ) is defined as a "forward-direction shift", and an operation for shifting a signal in a direction from the subsequent stage to the immediately preceding stage (in the order of unit shift registers $SR_n$, $SR_{n-1}$, $SR_{n-2}$ ... ) is defined as a "reverse-direction shift".

Figure 11:
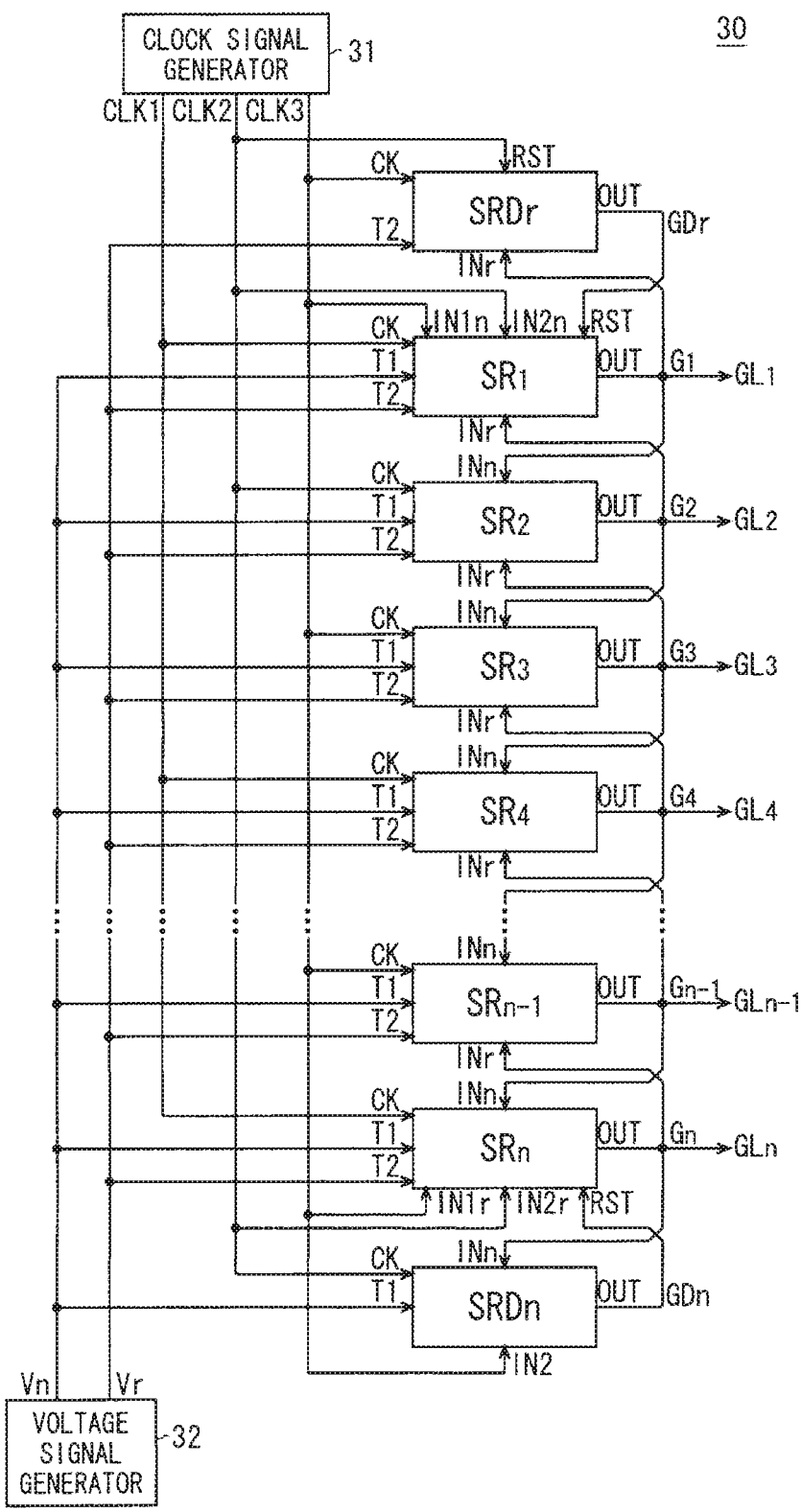
FIG. 11 is a block diagram of a gate-line drive circuit according to the preferred embodiment 2.

FIG. 11 is a block diagram showing a configuration of the gate-line drive circuit 30 according to the preferred embodiment 2. This gate-line drive circuit 30 includes the unit shift registers (bi-directional unit shift registers) $SR_1$, $SR_2$, $SR_3$, ... $SR_n$ capable of bi-directional shifting, a dummy unit shift register SRDn (hereinafter referred to as a "forward-direction dummy stage") provided in the further next stage of the last stage (unit shift register $SR_n$), and a dummy unit shift register SRDr (hereinafter referred to as a "reverse-direction dummy stage") provided in the further immediately preceding stage of the most preceding stage (unit shift register $SR_1$).

A voltage signal generator 32 generates a first voltage signal Vn and a second voltage signal Vr which define a signal shift direction (scanning direction of the gate line GL) in the gate-line drive circuit 30. The first voltage signal Vn and the second voltage signal Vr are signals complementary to each other. When the gate-line drive circuit 30 performs the forward-direction shift (hereinafter simply referred to as a "time of the forward-direction shift"), the first voltage signal Vn and the second voltage signal Vr are set at the H level and the L level, respectively. When the gate-line drive circuit 30 performs the reverse-direction shift (hereinafter simply referred to as a "time of the reverse-direction shift"), the second voltage signal Vr and the first voltage signal Vn are set at the H level and the L level, respectively.

The clock signal generator 31 outputs the clock signals CLK1, CLK2, CLK3 which are three-phase clock signals having different phases, and changes the order of bringing the clock signals CLK1, CLK2, CLK3 into the H level, in accordance with the signal shift direction. For example, the clock signals are brought into the H level in the order of CLK1, CLK2, CLK3, CLK1, . . . at the time of the forward-direction shift, and brought into the H level in the order of CLK3, CLK2, CLK1, CLK3, . . . at the time of the reverse-direction shift.

The signal supplied to the clock terminal CK of each unit shift register SR is basically the same as shown in FIG. 2. More specifically, the clock signal CLK1 is supplied to the unit shift registers $SR_1$, $SR_4$, $SR_7$ . . . which drive the gate lines $GL_{3m-2}$ of the (3m−2)th stage. The clock signal CLK2 is supplied to the unit shift registers $SR_2$, $SR_5$, $SR_8$ . . . which drive the gate lines $GL_{3m-1}$ of the (3m−1)th stage. The clock signal CLK3 is supplied to the unit shift registers $SR_3$, $SR_6$, $SR_9$ . . . which drive the gate lines $GL_{3m}$ of the (3m)th stage.

In this preferred embodiment, all the unit shift registers SR of the second to the (n−1)th stages have identical circuit configurations. However, the unit shift register $SR_1$ of the most preceding stage, the unit shift register $SR_n$ of the last stage, the forward-direction dummy stage SRDn, and the reverse-direction dummy stage SRDr have circuit configurations different from one another.

FIG. 12 is a circuit diagram of the unit shift registers $SR_k$ of the second to the (n−1)th stages. The configuration of this unit shift register $SR_k$ is almost the same as shown in FIG. 3, but different therefrom in terms of the following points.

That is, the unit shift register $SR_k$ of FIG. 12 includes a forward direction input terminal INn which receives the output signal $G_{k-1}$ of the immediately preceding stage, a reverse-direction input terminal INr which receives the output signal $G_{k+1}$ of the next stage, and first and second voltage signal terminals T1, T2 to which the first and second voltage signals Vn, Vr are supplied, respectively. Additionally, the transistor Q3 and the transistor Q4 are replaced with a transistor Q3n and a transistor Q3r, respectively. The transistor Q3n has its gate connected to the forward direction input terminal INn, and is connected between the node N1 and the first voltage signal terminal T1. The transistor Q3r has its gate connected to the reverse-direction input terminal INr, and is connected between the node N1 and the second voltage signal terminal T2.

FIG. 13 is a circuit diagram of the unit shift register $SR_1$ of the first stage. The unit shift register $SR_1$ is different from the circuit of FIG. 12, in terms of the following points.

First, in the unit shift register $SR_1$ of FIG. 13, the transistor Q3n of FIG. 12 is replaced with two transistors Q31n, Q32n connected in series with each other. When a connection node between the transistors Q31n, Q32n is defined as a "node N3n", the transistor Q31n has its gate connected to a first forward direction input terminal IN n, and is connected between the node N3n and the first voltage signal terminal T1. The transistor Q32n has its gate connected to a second forward direction input terminal IN2n, and is connected between the node N3n and the node N1. Similarly to FIG. 3, the unit shift register $SR_1$ of FIG. 13 includes the transistor Q4 having its gate connected to the reset terminal RST and being connected between the node N1 and the first power supply terminal S1.

In the unit shift register $SR_1$, the clock signals CLK2, CLK3 whose phases are different from each other and also different of the phase of the clock signal CLK inputted to the clock terminal CK are inputted to the first forward direction input terminal IN1n and the second forward direction input terminal IN2n, respectively. Here, the clock signal CLK2 is supplied to the first forward direction input terminal IN1n, and the clock signal CLK3 is supplied to the second forward direction input terminal IN2n. However, they may be exchanged.

In the unit shift register $SR_1$, the output signal $G_2$ of the unit shift register $SR_2$ is inputted to the reverse-direction input terminal INr, and an output signal GDr (hereinafter referred to as a "reverse-direction dummy signal") of the reverse-direction dummy stage SRDr is inputted to the reset terminal RST.

FIG. 14 is a circuit diagram of the n-th stage unit shift register $SR_n$. The unit shift register $SR_n$ is different from that of FIG. 12, in terms of the following points.

Firstly, in the unit shift register $SR_n$ of FIG. 14, the transistor Q3r of FIG. 12 is replaced with two transistors Q31r, Q32r connected in series with each other. When a connection node between the transistors Q31r, Q32r is defined as a "node N3r", the transistor Q31r has its gate connected to the first reverse-direction input terminal IN1r, and is connected between the node N3r and the second voltage signal terminal T2. The transistor Q32r has its gate connected to the second reverse-direction input terminal IN2r, and is connected between the node N3r and the node N1. Similarly to FIG. 3, the unit shift register $SR_n$ of FIG. 14 includes the transistor Q4 having its gate connected to the reset terminal RST and being connected between the node N1 and the first power supply terminal S1.

In the unit shift register $SR_n$, the clock signals CLK2, CLK3 whose phases are different from each other and also different from the phase of the clock signal CLK1 inputted to the clock terminal CK is inputted to the first reverse-direction input terminal IN1r and the second reverse-direction input terminal IN2r. Here, the clock signal CLK2 is supplied to the first reverse-direction input terminal IN1r, and the clock signal CLK3 is supplied to the second reverse-direction input terminal IN2r. However, they may be exchanged.

In the unit shift register $SR_n$, the output signal $G_{n-1}$ of the unit shift register $SR_{n-1}$ is inputted to the forward direction input terminal INn, and an output signal GDn (hereinafter referred to as a "forward-direction dummy signal") of the forward-direction dummy stage SRDn is inputted to the reset terminal RST.

FIG. 15 is a circuit diagram of the forward-direction dummy stage SRDn. The forward-direction dummy stage SRDn is different from the circuit of FIG. 12, in that the transistor Q3r is removed and that the transistor Q4 having its gate connected to the reset terminal RST and being connected between the node N1 and the first power supply terminal S1 is provided. In the forward-direction dummy stage SRDn, the output signal $G_n$ of the unit shift register $SR_n$ is inputted to the forward direction input terminal INn, the clock signal CLK2 is inputted to the clock terminal CK, and the clock signal CLK3 is inputted to the reset terminal RST.

FIG. 16 is a circuit diagram of the reverse-direction dummy stage SRDr. The reverse-direction dummy stage SRDr is different from the circuit of FIG. 12, in that the transistor Q3n is removed and that the transistor Q4 having its gate connected to the reset terminal RST and being connected between the node N and the first power supply terminal S1 is provided. In the reverse-direction dummy stage SRDr, the output signal $G_1$ of the unit shift register $SR_1$ is inputted to the reverse-direction input terminal INr, the clock signal CLK3 is inputted to the clock terminal CK, and the clock signal CLK2 is inputted to the reset terminal RST.

Figure 17:
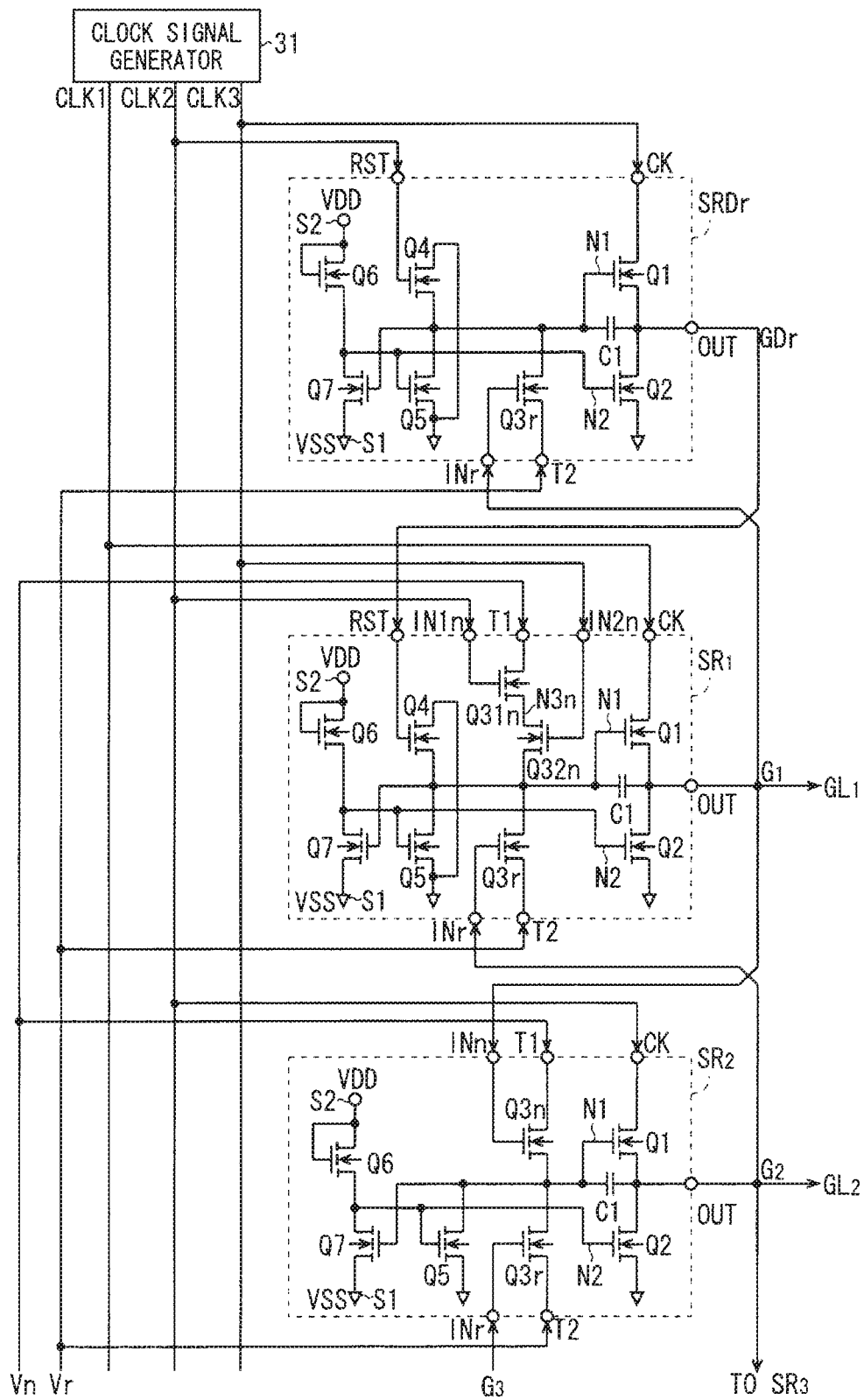
FIG. 17 is a diagram showing a circuit configuration of the gate-line drive circuit according to the preferred embodiment 2.

FIGS. 17 and 18 show a specific circuit configuration of the gate-line drive circuit 30. FIG. 17 shows the relationship of connection among the reverse-direction dummy stage SRDr and the unit shift registers $SR_1$, $SR_2$ which are the most preceding two stages. FIG. 18 shows the relationship of connection among the unit shift registers $SR_{n-1}$, $SR_n$ which are last two stages and the forward-direction dummy stage SRDn.

An operation of the gate-line drive circuit 30 according to this preferred embodiment at the time of the forward-direction shift will be described. In a case where the gate-line drive circuit 30 performs the forward-direction shift, the voltage signal generator 32 sets the first voltage signal Vn at the H level and the second voltage signal Vr at the L level, respectively.

Thus, in the unit shift register $SR_k$ (2≤k≤n−1) of FIG. 12, the transistor Q3n is equivalent to the transistor Q3 of FIG. 3, and the transistor Q3r is equivalent to the transistor Q4 of FIG. 3. Therefore, the unit shift register $SR_k$ of FIG. 12 is equivalent to the circuit of FIG. 3.

In the unit shift register $SR_1$ of FIG. 13, the transistors Q31n, Q32n are equivalent to the transistors Q31, Q32 of FIG. 4, and the transistor Q3r is equivalent to the transistor Q4 of FIG. 4. As will be described later, the reverse-direction dummy signal GDr is not activated at the time of the forward-direction shift, the transistor Q4 of FIG. 12 is kept OFF. Therefore, the unit shift register $SR_1$ of FIG. 13 is equivalent to the circuit of FIG. 4.

In the unit shift register $SR_n$ of FIG. 14, the transistor Q3n is equivalent to the transistor Q3 of FIG. 3, and the transistor Q4 is equivalent to the transistor Q4 of FIG. 3. Since the clock signals CLK2, CLK3 have different phases, the transistors Q31r, Q32r are not simultaneously turned ON, so that no conducting occurs between the node N1 and the second voltage signal terminal T2. As will be described later, the clock signals CLK2, CLK3 are simultaneously brought into the H level at the beginning of the frame period, and at that time, the transistors Q31r, Q32r are exceptionally turned ON simultaneously, which however does not influence the operation of the unit shift register $SR_n$ at the time of the forward-direction shift. Accordingly, the unit shift register $SR_n$ of FIG. 14 is equivalent to the circuit of FIG. 3.

In the forward-direction dummy stage SRDn of FIG. 15, the transistor Q3n is equivalent to the transistor Q3 of FIG. 3, and the transistor Q4 is equivalent to the transistor Q4 of FIG. 3. Therefore, the forward-direction dummy stage SRDn of FIG. 15 is equivalent to the circuit of FIG. 3.

In the reverse-direction dummy stage SRDr of FIG. 16, each of the transistors Q3r, Q4 corresponds to the transistor Q4 of FIG. 3, but nothing corresponds to the transistor Q3 of FIG. 3. Accordingly, the reverse-direction dummy stage SRDr is always in the reset state, and the reverse-direction dummy signal GDr is kept at the deactivation level. Therefore, the reverse-direction dummy stage SRDr of FIG. 16 is substantially in a resting state.

In the above-described manner, when the first voltage signal Vn and the second voltage signal Vr are at the H level and the L level, respectively, the gate-line drive circuit 30 (FIGS. 11, 17, and 18) according to this preferred embodiment is equivalent to the gate-line drive circuit 30 (FIGS. 2, 5, and 6) of the preferred embodiment 1, and the forward-direction shift operation is allowed.

Figure 19:
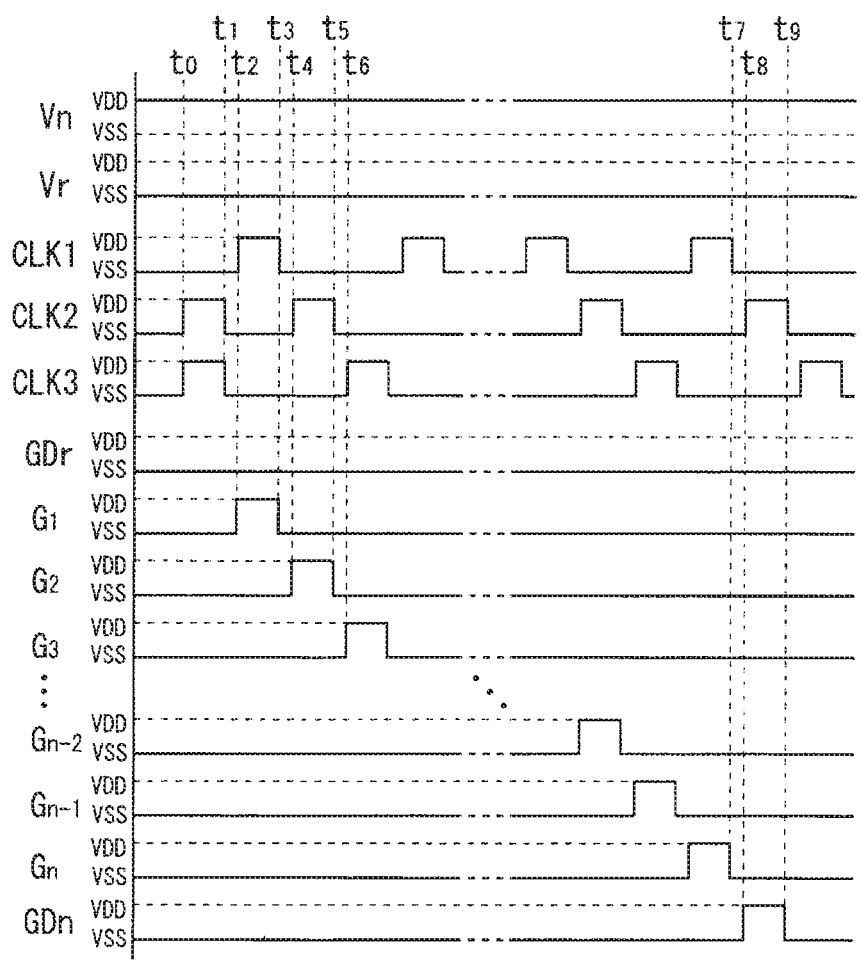
FIG. 19 is a timing chart showing an operation of the gate-line drive circuit according to the preferred embodiment 2 at a time of a forward-direction shift.

In this preferred embodiment, similarly to the preferred embodiment 1, no start pulse is used, and instead both of the clock signals CLK2, CLK3 are activated at the beginning of the frame period. In the gate-line drive circuit 30, as shown in FIG. 19, triggered by the simultaneous activation of the clock signals CLK2, CLK3, the output signals $G_1$, $G_2$, $G_3$, . . . , $G_n$ are sequentially activated at timings synchronized with the clock signals CLK1 to CLK3 (since the operation at the time of the forward-direction shift is the same as in the preferred embodiment 1, a detailed description thereof is omitted). Thereby, the gate-line drive circuit 30 can sequentially drive the gate lines $GL_1$, $GL_2$, $GL_3$, . . . , GL in a predetermined scanning cycle.

The times $t_0$ to $t_9$ of FIG. 19 correspond to those shown in FIG. 9, respectively. In this preferred embodiment, the unit shift register $SR_n$ shifts from the set state to the reset state in accordance with activation of the forward-direction dummy signal GDn which is activated next to its output signal $G_n$ (time $t_8$).

Next, an operation of the gate-line drive circuit 30 at the time of the reverse-direction shift will be described. In a case where the gate-line drive circuit 30 performs the reverse-direction shift, the voltage signal generator 32 sets the first voltage signal Vn and the second voltage signal Vr at the L level and the H level, respectively.

In the unit shift register $SR_k$ (2≤k≤n−1) of FIG. 12, the functions of the transistors Q3n, Q3r are exchanged as compared with at the time of the forward-direction shift. In other words, the transistor Q3r functions so as to charge the node N1, and the transistor Q3n functions so as to discharge the node N1. Thus, the unit shift register $SR_1$ of FIG. 12 is brought into the set state in accordance with activation of the next-stage output signal $G_{k+1}$, and into the reset state in accordance with activation of the output signal $G_{k-1}$ of the immediately preceding stage.

In the unit shift register $SR_1$ of FIG. 13, the transistor Q3r functions so as to charge the node N1, and the transistor Q4 functions so as to discharge the node N1. Since the clock signals CLK2, CLK3 have different phases, the transistors Q31n, Q32n are not simultaneously turned ON, so that no conducting occurs between the node N1 and the first voltage signal terminal T1. As will be described later, the clock signals CLK2, CLK3 are simultaneously brought into the H level at the beginning of the frame period, and at that time, the transistors Q31n, Q32n are exceptionally turned ON simultaneously, which however does not influence the operation of the unit shift register $SR_1$ at the time of reverse-direction shift. Accordingly, the unit shift register $SR_1$ of FIG. 13 is brought into the set state in accordance with activation of the second-stage output signal $G_2$, and into the reset state in accordance with activation of the reverse-direction dummy signal GDr.

In the unit shift register $SR_n$ of FIG. 14, the transistors Q31r, Q32r function so as to charge the node N1, and the transistor Q3n functions so as to discharge the node N1. As will be described later, since the forward-direction dummy signal GDn is not activated at the time of reverse-direction shift, the transistor Q4 of FIG. 14 is kept OFF. Therefore, the unit shift register $SR_n$ of FIG. 14 is brought into the set state in accordance with simultaneous activation of the clock signals CLK2, CLK3, and into the reset state in accordance with activation of the output signal $G_{n-1}$ of the (n−1)th stage.

In the forward-direction dummy stage SRDn of FIG. 15, each of the transistors Q3n, Q4 functions so as to discharge the node N1, but there is no transistor which charges the node N1. Accordingly, the forward-direction dummy stage SRDn is always in the reset state, and the forward-direction dummy signal GDn is kept at the deactivation level. Thus, the forward-direction dummy stage SRDn of FIG. 15 is substantially in the resting state.

In the reverse-direction dummy stage SRDr of FIG. 16, the transistor Q3r functions so as to charge the node N1, and the transistor Q4 functions so as to discharge the node N1. Accordingly, the reverse-direction dummy stage SRDr of FIG. 16 is brought into the set state in accordance with activation of the output signal $G_1$ of the first stage, and into the reset state in accordance with activation of the clock signal CLK2.

As a result, the gate-line drive circuit 30 (FIGS. 11, 17, and 18) according to this preferred embodiment is allowed to perform the reverse-direction shift operation. An operation of the gate-line drive circuit 30 at the time of the reverse-direction shift will be described with reference to FIG. 20.

At the time of the reverse-direction shift as well, both of the clock signals CLK2, CLK3 are activated at the beginning of each frame period (times $t_{10}$ to $t_{11}$). Thereby, the unit shift register $SR_n$ of the last stage is brought into the set state. Accordingly, next time the clock signal CLK1 is activated, the output signal $G_n$ of the last stage is activated (times $t_{12}$ to $t_{13}$). At this time, the unit shift register $SR_{n-1}$ is brought into the set state. Therefore, next time the clock signal CLK3 is activated, the output signal $G_{n-1}$ of the unit shift register $SR_{n-1}$ is activated (times $t_{14}$ to $t_{15}$). Subsequently, the output signals $G_{n-2}$, $G_{n-3}$, . . . , $G_1$ are sequentially activated at timings synchronized with the clock signals CLK1 to CLK3.

Figure 20:
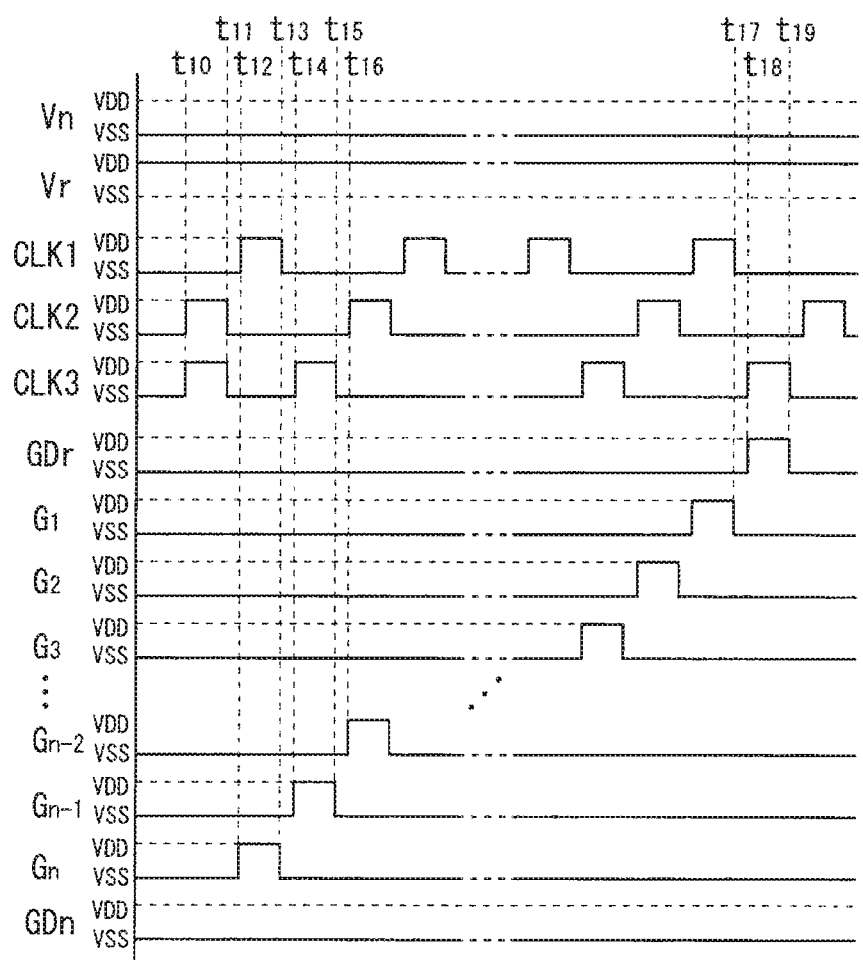
FIG. 20 is a timing chart showing an operation of the gate-line drive circuit according to the preferred embodiment 2 at a time a reverse-direction shift.

That is, at the time of the reverse-direction shift, as shown in FIG. 20, triggered by the simultaneous activation of the clock signals CLK2, CLK3, the gate-line drive circuit 30 sequentially activates the output signals $G_n$, $G_{n-1}$, $G_{n-2}$, . . . , $G_1$ at timings synchronized with the clock signals CLK1 to CLK3. Thereby, the gate-line drive circuit 30 can sequentially drive the gate lines $GL_n$, $GL_{n-1}$, $GL_{n-2}$, . . . , $GL_1$ in a predetermined scanning cycle.

The time $t_{17}$ of FIG. 20 indicates a time at which the activation period of the output signal $G_1$ of the most preceding stage (unit shift register $SR_1$) expires, and a period from the time $t_{17}$ to the time $t_{10}$ of the next frame is a "blanking period". The reverse-direction dummy signal GDr outputted by the reverse-direction dummy stage SRDr is activated when the clock signal CLK3 is activated next to the time $t_{17}$ (times $t_{18}$ to $t_{19}$), and in accordance therewith, the unit shift register $SR_1$ shifts from the set state to the reset state.

In this preferred embodiment, in the gate-line drive circuit 30 capable of bi-directional shifting, no start pulse generation circuit is required. Therefore, the area of the substrate can be reduced, which can contribute to a reduction in the manufacturing cost.

In an example shown in this preferred embodiment, the unit shift register $SR_k$ is operated by using the three-phase clock signals CLK1 to CLK3. However, the unit shift register SIR may be operated by using clock signals of four or more phases.

Modification

FIG. 11 shows the gate-line drive circuit 30 including the dummy unit shift register (the forward-direction dummy stage SRDn and the reverse-direction dummy stage SRDr). In this modification, a method in which the dummy unit shift register is not necessary is shown.

FIG. 21 is a block diagram of a gate-line drive circuit 30 according to this modification. FIG. 21 is the same as FIG. 11, except that the forward-direction dummy stage SRDn and the reverse-direction dummy stage SRDr are removed. Along with the removal of the forward-direction dummy stage SRDn and the reverse-direction dummy stage SRDr, the reset terminals RST included in the unit shift registers $SR_1$, $SR_n$ of FIG. 11 are also unnecessary.

Figure 22:
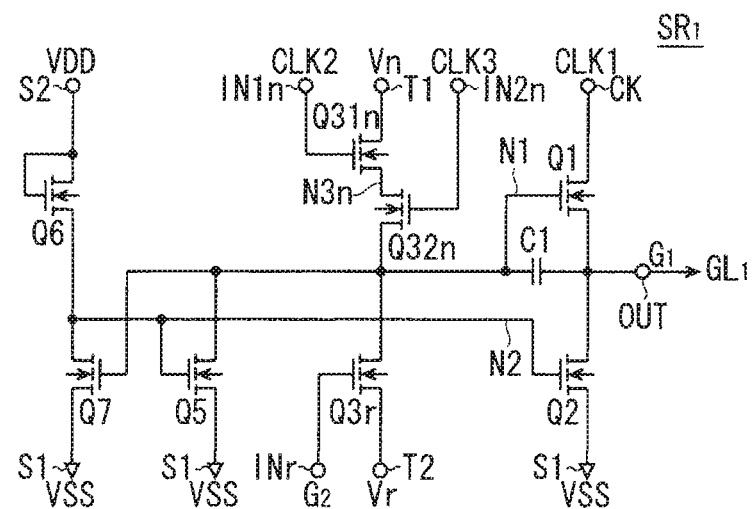
FIG. 22 is a circuit diagram of a first-stage unit shift register according to the modification of the preferred embodiment 2.
Figure 23:
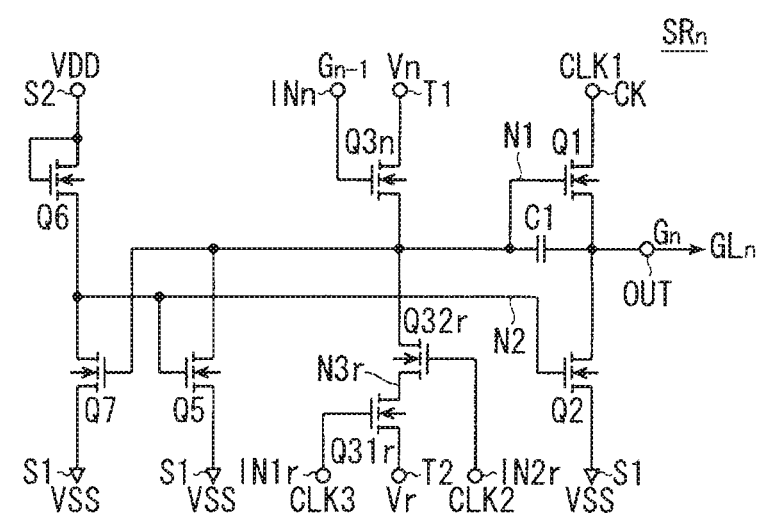
FIG. 23 is a circuit diagram of a last-stage unit shift register according to the modification of the preferred embodiment 2.

In the gate-line drive circuit 30 of this modification, each of the unit shift registers $SR_k$ of the second to the (n−1)th stages is the same as the circuit of FIG. 12. A circuit diagram of the unit shift register $SR_1$ of the first stage is shown in FIG. 22. The unit shift register $SR_1$ is the same as the circuit of FIG. 13, except that the transistor Q4 is removed. A circuit diagram of the unit shift register $SR_n$ of the last stage is shown in FIG. 23. The unit shift register $SR_n$ is the same as the circuit of FIG. 14, except that the transistor Q4 is removed.

Figure 25:
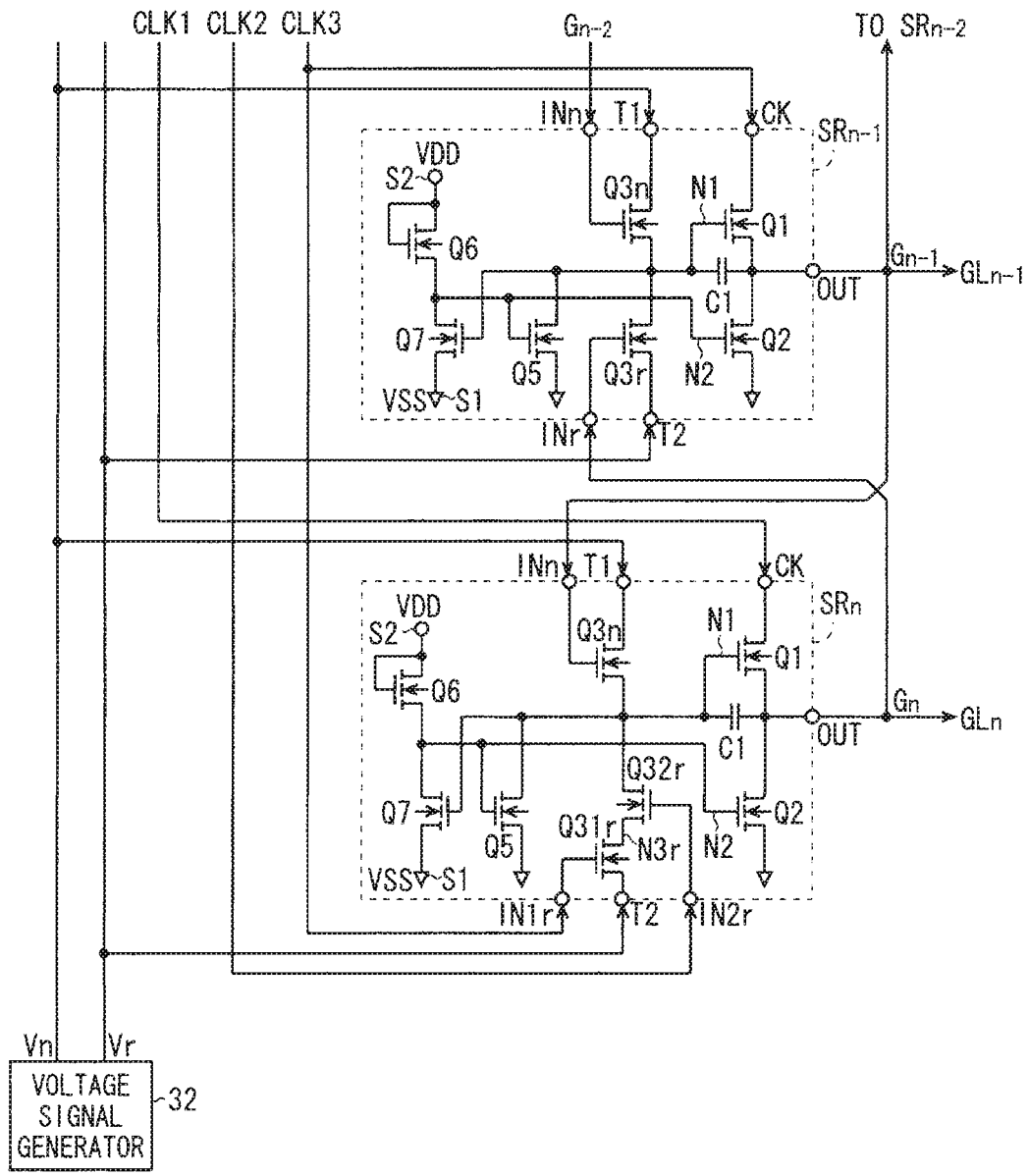
FIG. 25 is a diagram showing a circuit configuration of the gate-line drive circuit according to the modification of the preferred embodiment 2.

FIGS. 24 and 25 show a specific circuit configuration of the gate-line drive circuit 30. FIG. 24 shows the relationship of connection between the unit shift registers $SR_1$, $SR_2$ which are the most preceding two stages. FIG. 25 show the relationship of connection between the unit shift registers $SR_{n-1}$, $SR_n$ which are the last two stages.

FIG. 26 is a timing chart showing an operation of the gate-line drive circuit 30 according to this modification at the time of the forward-direction shift. The times $t_0$ to $t_9$ of FIG. 26 correspond to those shown in FIG. 19, respectively.

At the time of the forward-direction shift, the first voltage signal Vn is set at the H level, and the second voltage signal Vr is set at the L level. In this case, in the unit shift register $SR_1$ (FIG. 22) of the most preceding stage, the transistors Q3n, Q3r are equivalent to the transistor Q3 of FIG. 4, and the transistor Q3r is equivalent to the transistor Q4 of FIG. 4. Therefore, this unit shift register $SR_1$ is equivalent to the circuit of FIG. 4. The unit shift registers $SR_k$ (FIG. 12) of the second to the (n−1)th stages are equivalent to the circuit of FIG. 3. In the unit shift register $SR_n$ (FIG. 23) of the last stage, the transistor Q3n functions so as to charge the node N1, and the transistors Q31r, Q32r function so as to discharge the node N1.

In this modification as well, both of the clock signals CLK2, CLK3 are activated at the beginning (times $t_0$ to $t_1$) of the frame period. Triggered by the simultaneous activation of the clock signals CLK2, CLK3, the gate-line drive circuit 30 sequentially activates the output signals $G_1$, $G_2$, $G_3$, . . . , $G_n$ at timings synchronized with the clock signals CLK1 to CLK3, as shown in FIG. 26. Thereby, the gate-line drive circuit 30 can sequentially drive the gate lines $GL_1$, $GL_2$, $GL_3$ . . . in a predetermined scanning cycle.

However, in this modification, at the time $t_8$ after the activation period of the unit shift register $SR_n$ of the last stage expires, both of the clock signals CLK2, CLK3 are set at the H level, and additionally the first voltage signal Vn is set at the L level.

When both of the clock signals CLK2, CLK3 are set at the H level, the transistors Q31r, Q32r are turned ON to discharge the node N1 in the unit shift register $SR_n$. Thus, the unit shift register $SR_n$ shifts from the set state to the reset state.

On the other hand, in the unit shift register $SR_1$, the transistors Q31n, 32n are also turned ON, but the first voltage signal Vn is set at the L level and therefore the unit shift register $SR_1$ is kept in the reset state. When the unit shift register $SR_1$ is brought into the set state at the time $t_8$, the output signal $G_1$ is erroneously activated in the blanking period. In order to prevent this, the first voltage signal Vn is set at the L level at the time $t_8$.

Then, at the time $t_9$, the clock signals CLK2, CLK3 are set at the L level, and the first voltage signal Vn is returned to the H level. At this time, a timing of returning the first voltage signal Vn to the H level is simultaneous with, or preferably later than, a timing of bringing the clock signals CLK2, CLK3 into the L level. If the first voltage signal Vn becomes the H level before the clock signals CLK2, CLK3 become the L level, the node N1 of the unit shift register $SR_1$ is charged by the transistors Q31n, Q32n and an erroneous operation may be caused. The first voltage signal Vn may be kept at the L level until the beginning (time $t_0$) of the next frame period.

Figure 27:
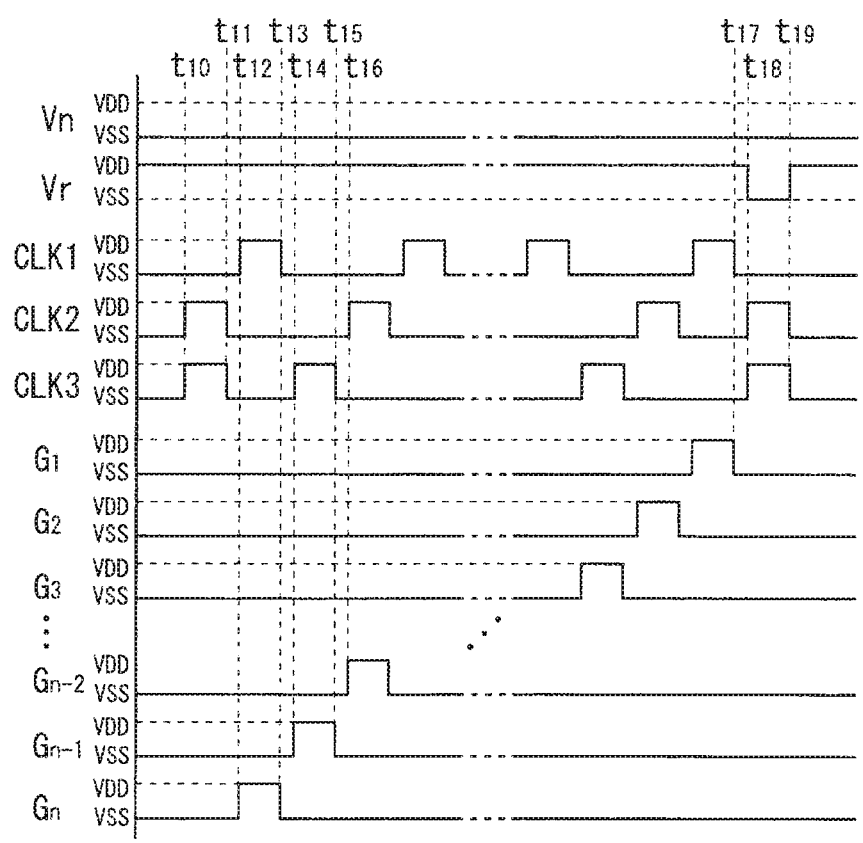
FIG. 27 is a timing chart showing an operation of the gate-line drive circuit according to the modification of the preferred embodiment 2 at a time of the reverse-direction shift.

FIG. 27 is a timing chart showing an operation of the gate-line drive circuit 30 at the time of reverse-direction shift. The times $t_{10}$ to $t_{19}$ of FIG. 27 correspond to those shown in FIG. 20, respectively.

At the time of the reverse-direction shift, the first voltage signal Vn is set at the L level, and the second voltage signal Vr is set at the H level. In this case, in the unit shift register $SR_1$ (FIG. 22) of the most preceding stage, the transistors Q31n, Q32n function so as to discharge the node N1, and the transistor Q3r functions so as to charge the node N1. The unit shift registers $SR_k$ (FIG. 12) of the second to the (n−1)th stages can perform the reverse-direction shift operation. In the unit shift register $SR_n$ (FIG. 23) of the last stage, the transistor Q3n functions so as to discharge the node N1, and the transistors Q31r, Q32r function so as to charge the node N1.

In this modification as well, both of the clock signals CLK2, CLK3 are activated at the beginning (times $t_{10}$ to $t_{11}$) of the frame period. Triggered by this, the gate-line drive circuit 30 sequentially activates the output signals $G_n$, $G_{n-1}$, $G_{n-2}$, ..., $G_1$ at timings synchronized with the clock signals CLK1 to CLK3, as shown in FIG. 27. Thereby, the gate-line drive circuit 30 can sequentially drive the gate lines $GL_n$, $GL_{n-1}$, $GL_{n-1}$, ..., $GL_1$ in a predetermined scanning cycle.

At the time of the reverse-direction shift, both of the clock signals CLK2, CLK3 are set at the H level and the second voltage signal Vr is set at the L level, at the time $t_1$ after the activation period of the unit shift register $SR_1$ of the most preceding stage expires.

Thereby, in the unit shift register $SR_1$, the transistors Q31n, Q32n are turned ON to discharge the node N1. Thus, the unit shift register $SR_1$ shifts from the set state to the reset state. At this time, the transistors Q31r. 32r are also turned ON in the unit shift register $SR_n$, too. However, the second voltage signal Vr is set at the L level, and therefore the unit shift register $SR_n$ is kept at the reset state, so that occurrence of an erroneous operation is prevented.

Then, at the time $t_{19}$, the clock signals CLK2, CLK3 are set at the L level, and the second voltage signal Vr is returned to the H level. A timing of returning the second voltage signal Vr to the H level is simultaneous with, or preferably later than, a timing when the clock signals CLK2, CLK3 become the L level. If the second voltage signal Vr becomes the H level before the clock signals CLK2, CLK3 become L level, node N1 of the unit shift register $SR_n$ may be charged by the transistors Q31r, Q32r and the unit shift register $SR_n$ cannot be kept in the set state. The second voltage signal Vr may be kept at the L level until the beginning (time $t_{10}$) of the next frame period.

According to this modification, since it is not necessary to provide a dummy unit shift register (the forward-direction dummy stage SRDn and the reverse-direction dummy stage SRDr) in the gate-line drive circuit 30, the area where the circuit is formed can be reduced.

Preferred Embodiment 3

The bi-directional unit shift register shown in FIG. 12 can also be driven by using two-phase clock signals. However, in the preferred embodiment 2, the gate-line drive circuit 30 is driven by using the three-phase clock signals CLK1 to CLK3, because at least three-phase clock signals are required for controlling the unit shift register $SR_1$ of the most preceding stage and the unit shift register $SR_n$ of the last stage. In this preferred embodiment, proposed is a gate-line drive circuit 30 capable of bi-directional shifting which requires no start pulse and can be operated by using two-phase clock signals.

Figure 28:
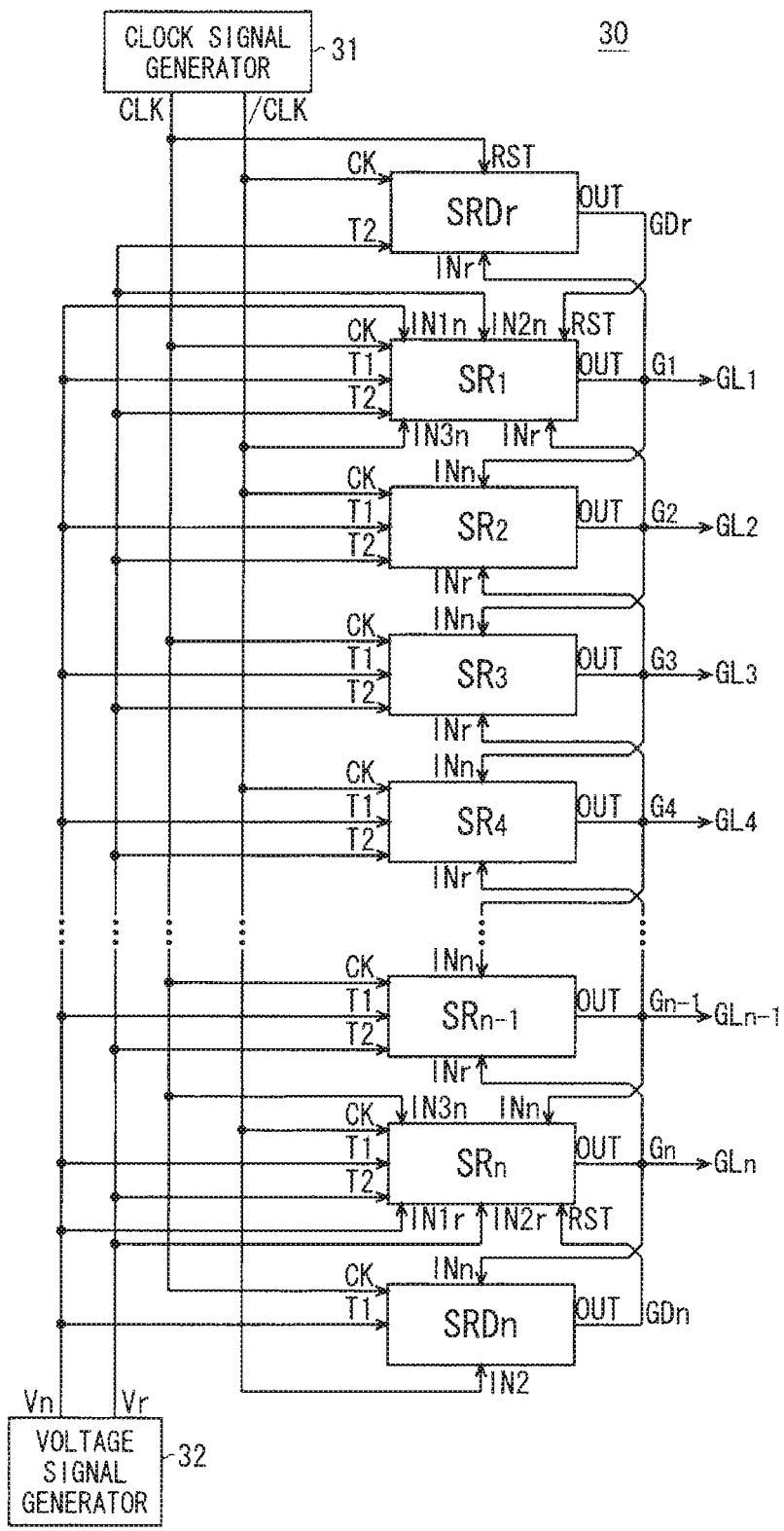
FIG. 28 is a block diagram of a gate-line drive circuit according to a preferred embodiment 3.

FIG. 28 is a block diagram of a gate-line drive circuit according to a preferred embodiment 3. The clock signal generator 31 of this preferred embodiment generates two-phase clock signals CLK, /CLK having different phases, and one of them is inputted to the clock terminal CK of each unit shift register SR. In an example shown in FIG. 28, the clock signal CLK is inputted to the clock terminal CK of each of the unit shift registers $SR_1$, $SR_3$, $SR_5$, ..., $SR_{n-1}$ of the odd-numbered stages, and the clock signal /CLK is inputted to the clock terminal CK of each of the unit shift registers $SR_2$, $SR_4$, $SR_6$, ..., $SR_n$ of the even-numbered stages.

The reverse-direction dummy stage SRDr is provided in the immediately preceding stage of the unit shift register $SR_1$, and the forward-direction dummy stage SRDn is provided in the next stage of the unit shift register $SR_n$.

In the gate-line drive circuit 30 of this modification, each of the unit shift registers $SR_k$ of the second to the (n−1)th stages is the same as the circuit of FIG. 12.

Figure 29:
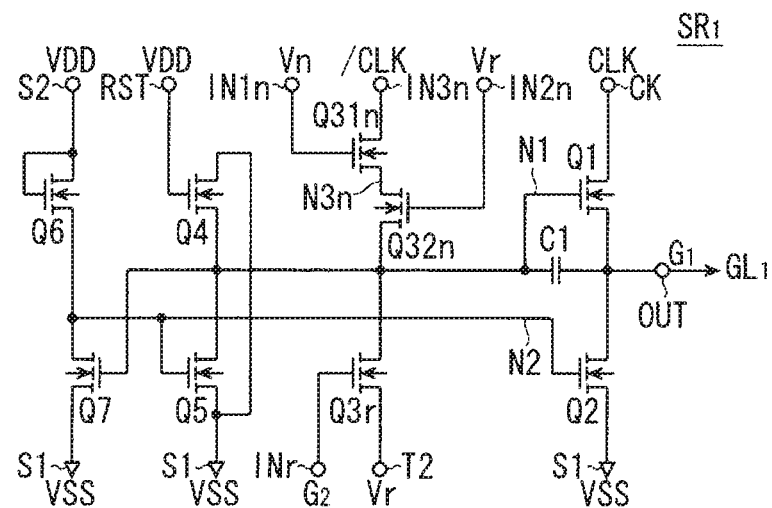
FIG. 29 is a circuit diagram of a first-stage (most-preceding stage) unit shift register according to the preferred embodiment 3.

FIG. 29 shows a circuit diagram of the unit shift register $SR_1$ of the first stage. The circuit configuration of the unit shift register $SR_1$ is almost the same as that of the circuit of FIG. 13, except that the current electrode of the transistor Q31n is connected to a third forward direction input terminal IN3n instead of the first voltage signal terminal T1. The first voltage signal Vn is inputted to the first forward direction input terminal IN1n (the gate of the transistor Q31n), and the second voltage signal Vr is inputted to the second forward direction input terminal IN2n (the gate of the transistor Q32n). The clock signal /CLK whose phase is different from the phase of the clock signal CLK inputted to the clock terminal CK is inputted to the third forward direction input terminal IN3n.

The signals inputted to the first forward direction input terminal IN1n and the second forward direction input terminal IN2n may be exchanged. In other words, the second voltage signal Vr may be inputted to the first forward direction input terminal IN1n, and the first voltage signal Vn may be inputted to the second forward direction input terminal IN2n.

Figure 30:
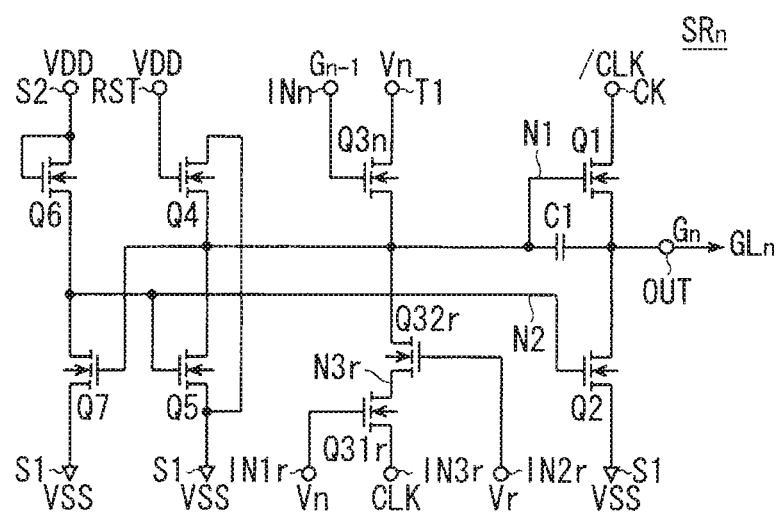
FIG. 30 is a circuit diagram of an n-th stage (last-stage) unit shift register according to the preferred embodiment 3.

FIG. 30 shows a circuit diagram of the unit shift register $SR_n$ of the last stage. The circuit configuration of this unit shift register $SR_n$ is almost the same as that of the circuit of FIG. 14, except that the current electrode of the transistor Q31r is connected to a third reverse-direction input terminal IN3r instead of the second voltage signal terminal T2. The first voltage signal Vn is inputted to the first reverse-direction input terminal IN1r (the gate of the transistor Q31r), and the second voltage signal Vr is inputted to the second reverse-direction input terminal IN2r (the gate of the transistor Q32r). The clock signal CLK whose phase is different from the phase of the clock signal /CLK inputted to the clock terminal CK is inputted to the third reverse-direction input terminal IN3r.

The signals inputted to the first reverse-direction input terminal IN1r and the second reverse-direction input terminal IN2r may be exchanged. In other words, the second voltage signal Vr may be inputted to the first reverse-direction input terminal IN1r, and the first voltage signal Vn may be inputted to the second reverse-direction input terminal IN2r.

Figure 31:
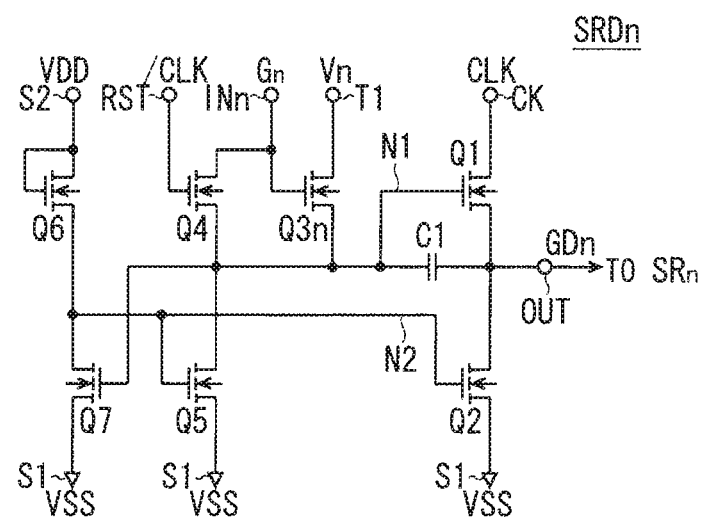
FIG. 31 is a circuit diagram of a dummy unit shift register provided in the next stage of a last-stage.

FIG. 31 shows a circuit diagram of the forward-direction dummy stage SRDn. The circuit configuration of this forward-direction dummy stage SRDn is almost the same as that of the circuit of FIG. 15, except that the source of the transistor Q4 is connected to the forward direction input terminal INn. The clock signal CLK and the clock signal /CLK are inputted to the clock terminal CK and the reset terminal RST of the forward-direction dummy stage SRDn, respectively.

Figure 32:
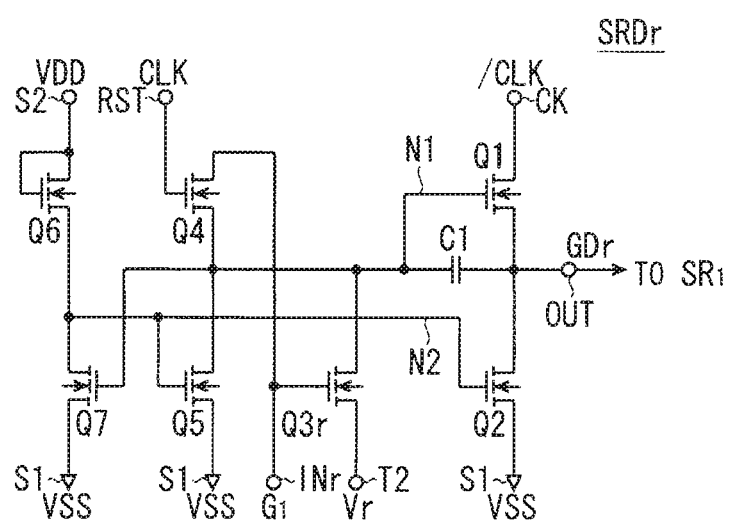
FIG. 32 is a circuit diagram of a dummy unit shift register provided in the immediately preceding stage of the first-stage.

FIG. 32 shows a circuit diagram of the reverse-direction dummy stage SRDr. The circuit configuration of this reverse-direction dummy stage SRDr is almost the same as that of the circuit of FIG. 15, except that the source of the transistor Q4 is connected to the reverse-direction input terminal INr. The clock signal /CLK and the clock signal CLK are inputted to the clock terminal CK and the reset terminal RST of the reverse-direction dummy stage SRDr, respectively.

Figure 33:
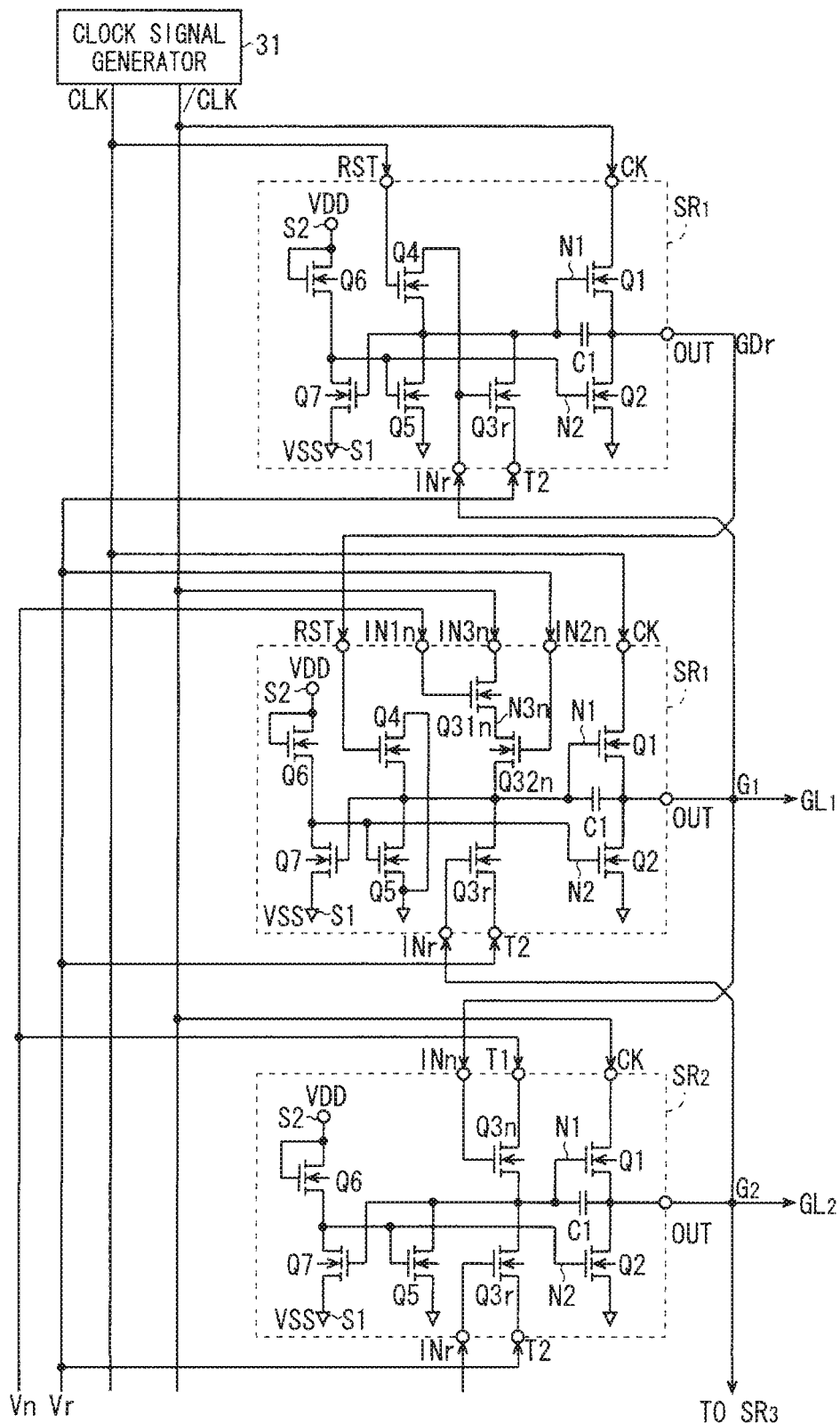
FIG. 33 is a diagram showing a circuit configuration of the gate-line drive circuit according to the preferred embodiment 3.
Figure 34:
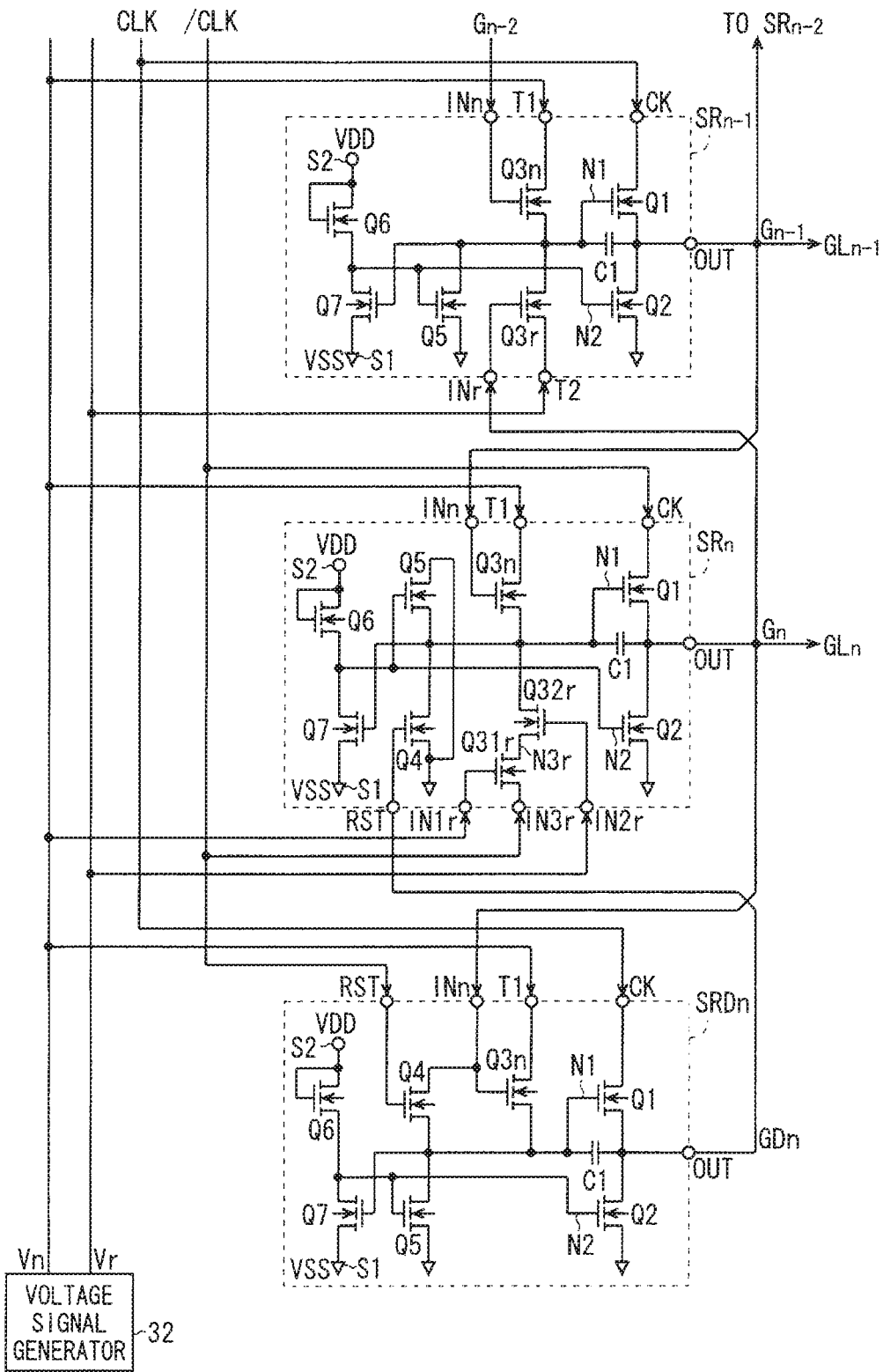
FIG. 34 is a diagram showing a circuit configuration of the gate-line drive circuit according to the preferred embodiment 3.

FIGS. 33 and 34 show a specific circuit configuration of the gate-line drive circuit 30. FIG. 33 shows the relationship of connection among the reverse-direction dummy stage SRDr and the unit shift registers $SR_1$, $SR_2$ which are the most preceding two stages. FIG. 34 shows the relationship of connection among the forward-direction dummy stage SRDn and the unit shift registers $SR_{n-1}$, $SR_n$ which are the last two stages.

Figure 35:
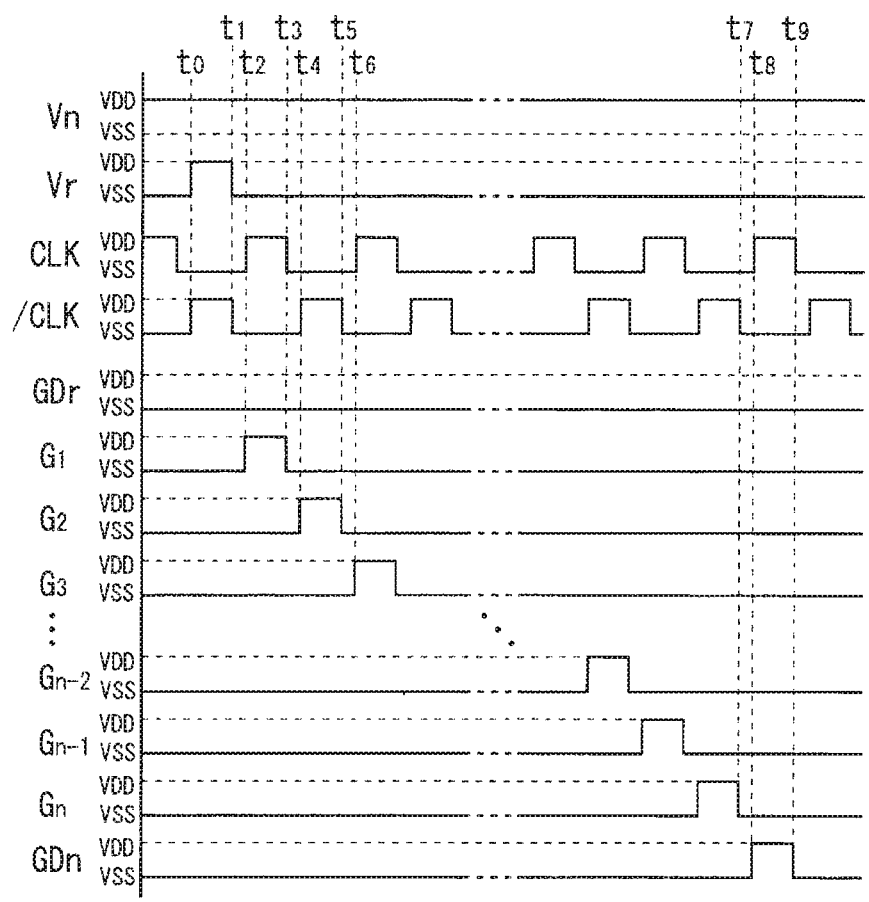
FIG. 35 is a timing chart showing an operation of the gate-line drive circuit according to the preferred embodiment 3 at a time of the forward-direction shift.

FIG. 35 is a timing chart showing an operation at the time of the forward-direction shift of the gate-line drive circuit 30 according to this modification. The times $t_0$ to $t_9$ of FIG. 35 correspond to those shown in FIG. 19, respectively.

At the time of the forward-direction shift, the first voltage signal Vn is set at the H level and the second voltage signal Vr is set at the L level. When the clock signal /CLK is activated at the beginning of each frame, both of the first and second voltage signals Vn, Vr are set at the H level (times $t_0$ to $t_1$). Thus, in the unit shift register $SR_1$, the transistors Q31n, Q32n are turned ON and the third forward direction input terminal IN3n is at the H level, and therefore the node N1 is charged. Accordingly, the unit shift register $SR_1$ is brought into the set state.

If the second voltage signal Vr becomes the H level at the times $t_0$ to $t_1$, the second voltage signal terminal T2 of each of the unit shift registers SR and the reverse-direction dummy stage SRDr also becomes H level. However, all of the transistors (Q3r, Q31r) connected thereto are turned OFF. Thus, an operation of the gate-line drive circuit 30 is not influenced.

Then, at the time $t_1$, the second voltage signal Vr is returned to the L level while the first voltage signal Vn is kept at the H level. At this time, a timing of returning the second voltage signal Vr to the L level is simultaneous with, or preferably later than, a timing when the clock signal /CLK becomes the L level. This is because if both of the first and second voltage signals Vn, Vr are at the H level even after the clock signal /CLK becomes the L level, the node N1 of the unit shift register $SR_1$ may be discharged by the transistors Q31n, Q32n and the unit shift register $SR_1$ may return to the reset state before activating the output signal $G_1$.

Then, when the clock signal CLK becomes the H level, the output signal $G_1$ of the unit shift register $SR_1$ becomes the H level (times $t_2$ to $t_3$). Subsequently, as shown in FIG. 35, the output signals $G_2$, $G_3$, ..., $G_n$ are sequentially activated at timings synchronized with the clock signals CLK, /CLK. Thereby, the gate-line drive circuit 30 can sequentially drive the gate lines $GL_1$, $GL_2$, $GL_3$, ..., $G_n$ in a predetermined scanning cycle.

When the output signal $G_n$ of the last stage becomes the H level, the forward-direction dummy stage SRDn (FIG. 31) is brought into the set state. Therefore, when the clock signal CLK becomes the H level next time, the forward-direction dummy signal GDn becomes the H level (time $t_8$), thus bringing the unit shift register $SR_n$ into the reset state.

In this preferred embodiment, the source of the transistor Q4 of the forward-direction dummy stage SRDn is connected to the forward direction input terminal INn. This is for the purpose of preventing the transistor Q4 from discharging the node N1 when the transistor Q3n charges the node N1 in accordance with activation of the output signal $G_n$ of the last stage.

Figure 36:
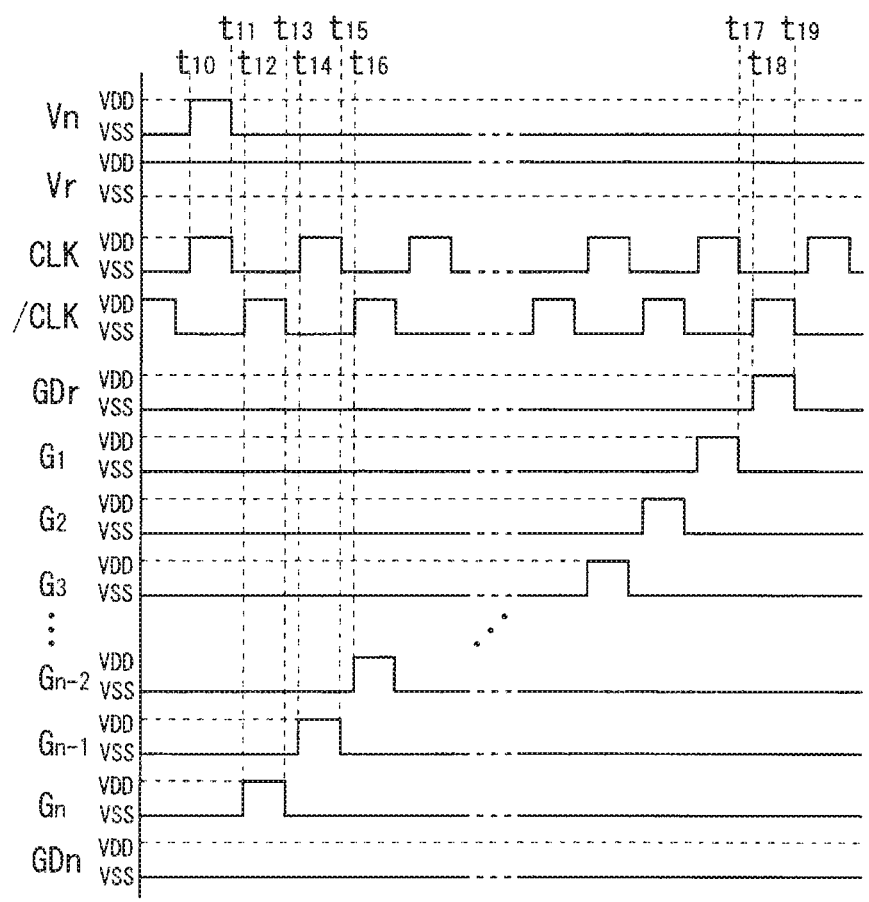
FIG. 36 is a timing chart showing an operation of the gate-line drive circuit according to the preferred embodiment 3 at a time of the reverse-direction shift.

FIG. 36 is a timing chart showing an operation of the gate-line drive circuit 30 according to this modification at the time of the reverse-direction shift. The times $t_{10}$ to $t_{19}$ of FIG. 36 correspond to those shown in FIG. 20, respectively.

At the time of the reverse-direction shift, the first voltage signal Vn is set at the L level, and the second voltage signal Vr is set at the H level. When the clock signal CLK is activated at the beginning of each frame, both of the first and second voltage signals Vn, Vr are set at the H level (times $t_{10}$ to $t_{11}$). Thus, in the unit shift register $SR_n$, the transistors Q31r, Q32r are turned ON and the third reverse-direction input terminal IN3r is at the H level, and therefore the node N1 is charged. Accordingly, the unit shift register $SR_n$ is brought into the set state.

If the first voltage signal Vn becomes the H level at the times $t_{10}$ to $t_{11}$, the first voltage signal terminal T1 of each of the unit shift registers SR and the forward-direction dummy stage SRDn also becomes H level. However, all of the transistors (Q3n, Q31n) connected thereto are turned OFF. Thus, an operation of the gate-line drive circuit 30 is not influenced.

Then, at the time $t_{11}$, the first voltage signal Vn is returned to the L level while the second voltage signal Vr is kept at the H level. At this time, a timing of returning the first voltage signal Vn to the L level is simultaneous with, or preferably later than, a timing when the clock signal CLK becomes the L level. This is because if both of the first and second voltage signals Vn, Vr are at the H level even after the clock signal CLK becomes the L level, the node N1 of the unit shift register $SR_n$ may be discharged by the transistors Q31r, Q32r and the unit shift register $SR_n$ may return to the reset state before activating the output signal $G_n$.

Then, when the clock signal /CLK becomes the H level, the output signal $G_n$ of the unit shift register $SR_n$ becomes the H level (times $t_{12}$ to $t_{13}$). Subsequently, as shown in FIG. 36, the output signals $G_{n-1}$, $G_{n-2}$, ..., $G_1$ are sequentially activated at timings synchronized with the clock signals CLK, /CLK. Thereby, the gate-line drive circuit 30 can sequentially drive the gate lines $GL_n$, $GL_{n-1}$, $GL_{n-2}$, ..., $GL_1$ in a predetermined scanning cycle.

When the output signal $G_1$ of the most preceding stage becomes the H level, the reverse-direction dummy stage SRDr (FIG. 32) is brought into the set state. Therefore, when the clock signal /CLK becomes the H level next time, the reverse-direction dummy signal GDr becomes the H level (time $t_{18}$), thus bringing the unit shift register $SR_1$ into the reset state.

In this preferred embodiment, the source of the transistor Q4 of the reverse-direction dummy stage SRDr is connected to the reverse-direction input terminal INr. This is for the purpose of preventing the transistor Q4 from discharging the node N1 when the transistor Q3r charges the node N in accordance with activation of the output signal $G_1$ of the most preceding stage.

Modification

In this modification, a method for eliminating the need for the dummy unit shift register will be shown.

Figure 37:
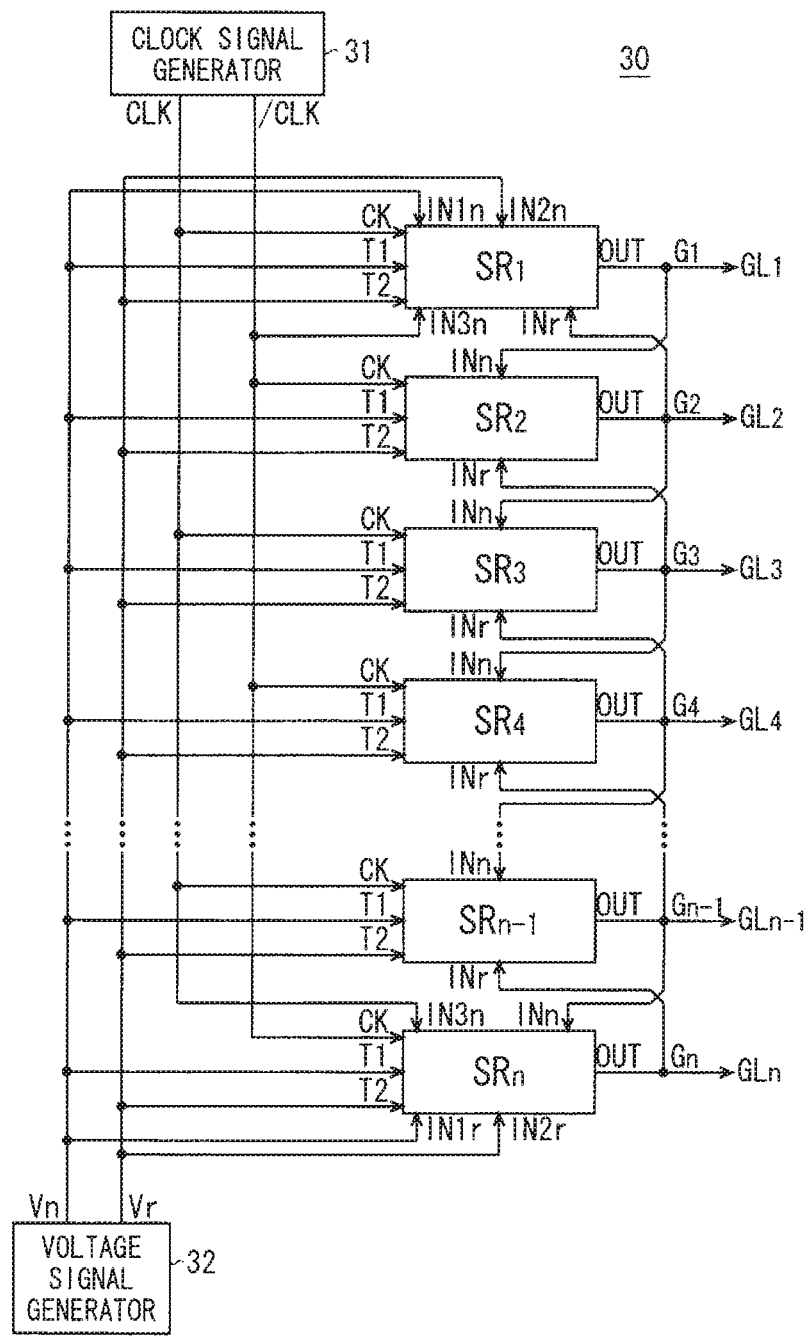
FIG. 37 is a block diagram of a gate-line drive circuit according to a modification of the preferred embodiment 3.

FIG. 37 is a block diagram of the gate-line drive circuit 30 according to this modification. FIG. 37 is the same as FIG. 28, except that the forward-direction dummy stage SRDn and the reverse-direction dummy stage SRDr are not provided. Since the forward-direction dummy stage SRDn and the reverse-direction dummy stage SRDr are not provided, the reset terminals RST included in the unit shift registers $SR_1$, $SR_n$ of FIG. 28 are no longer necessary.

Figure 38:
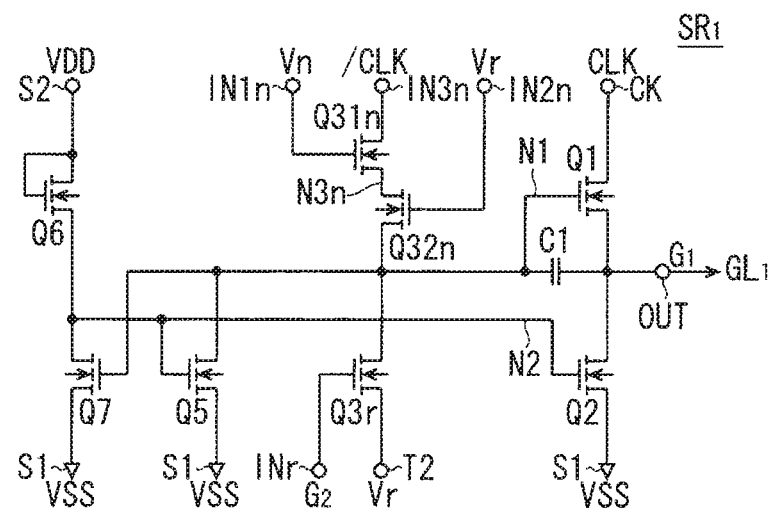
FIG. 38 is a circuit diagram of a first-stage unit shift register according to the modification of the preferred embodiment 3.
Figure 39:
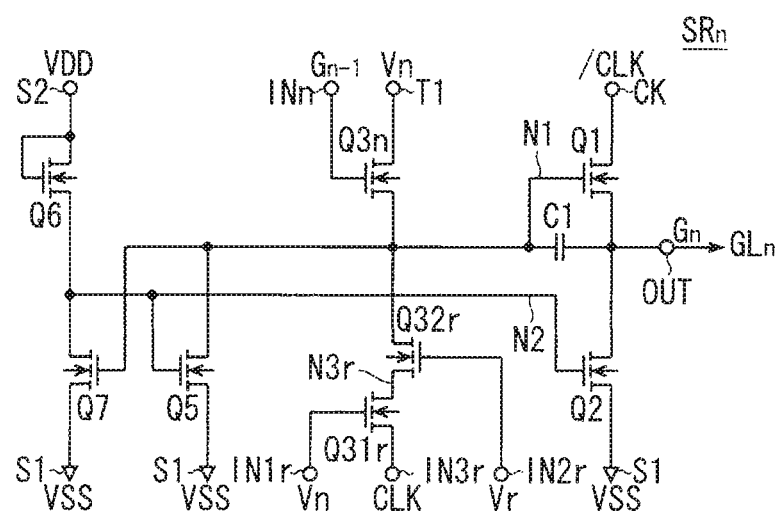
FIG. 39 is a circuit diagram of a last-stage unit shift register according to the modification of the preferred embodiment 3.

In the gate-line drive circuit 30 of this modification, each of the unit shift registers $SR_k$ of the second to the (n−1)th stages is the same as the circuit of FIG. 12. FIG. 38 shows a circuit diagram of the unit shift register $SR_1$ of the first stage. This unit shift register $SR_1$ is different from the circuit of FIG. 29 only in that the transistor Q4 is not provided. FIG. 39 shows a circuit diagram of the unit shift register $SR_n$ of the last stage. This unit shift register $SR_n$ is different from the circuit of FIG. 30 only that the transistor Q4 is not provided.

FIGS. 40 and 41 show a specific circuit configuration of the gate-line drive circuit 30. FIG. 40 shows the relationship of connection between the unit shift registers $SR_1$, $SR_2$ which are the most preceding two stages. FIG. 41 show the relationship of connection between the unit shift registers $SR_{n-1}$, $SR_n$ which are the last two stages.

Figure 42:
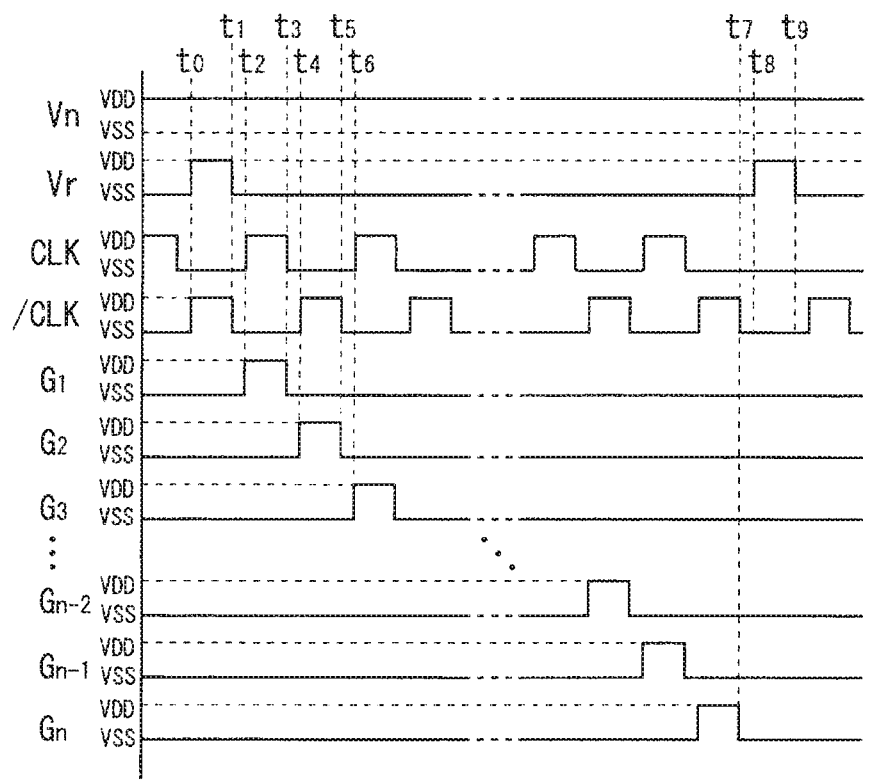
FIG. 42 is a timing chart showing an operation of the gate-line drive circuit according to the modification of the preferred embodiment 3 at a time of the forward-direction shift.

FIG. 42 is a timing chart showing an operation of the gate-line drive circuit 30 according to this modification at the time of the forward-direction shift. The times $t_0$ to $t_9$ of FIG. 42 correspond to those shown in FIG. 35, respectively.

An operation of the gate-line drive circuit 30 from the time $t_0$ to the time $t_7$ is the same as FIG. 35. That is, in this modification, too, when the clock signal /CLK is activated at the beginning (times $t_0$ to $t_1$) of the frame period, both of the first and second voltage signals Vn, Vr are set at the H level. Triggered by this, the gate-line drive circuit 30 sequentially activates the output signals $G_1$, $G_2$, $G_3$, . . . , $G_n$ at timings synchronized with the clock signals CLK, /CLK as shown in FIG. 42. Thereby, the gate-line drive circuit 30 can sequentially drive the gate lines $GL_1$, $GL_2$, $GL_3$ . . . , $GL_n$ in a predetermined scanning cycle.

However, in this modification, at the time $t_8$ after the activation period of the unit shift register $SR_n$ of the last stage expires, both of the first and second voltage signals Vn, Vr are set at the H level, and additionally both of the clock signals CLK, /CLK are set at the L level.

Thereby, in the unit shift register $SR_n$, the transistors Q31r, Q32r are turned ON to discharge the node N1. Thus, the unit shift register $SR_n$ shifts from the set state to the reset state. At this time, the transistor Q31n, 32n of the unit shift register $SR_1$ are also turned ON, but the third forward direction input terminal IN3n is set at the L level, and therefore the unit shift register $SR_1$ is kept in the reset state.

Figure 43:
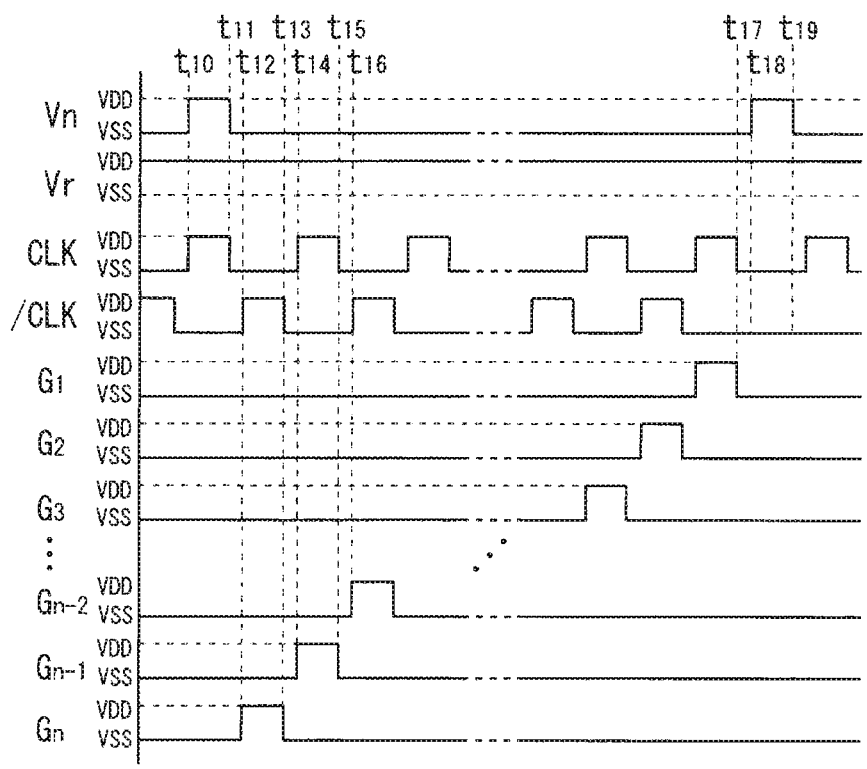
FIG. 43 is a timing chart showing an operation of the gate-line drive circuit according to the modification of the preferred embodiment 3 at a time of the reverse-direction shift.

FIG. 43 is a timing chart showing an operation of the gate-line drive circuit 30 according to this modification at the time of the reverse-direction shift. The times $t_{10}$ to $t_{19}$ of FIG. 43 correspond to those shown in FIG. 36, respectively.

An operation of the gate-line drive circuit 30 from the time $t_{10}$ to the time $t_{17}$ is the same as FIG. 36. That is, in this modification, too, when the clock signal CLK is activated at the beginning (times $t_{10}$ to $t_{11}$) of the frame period, both of the first and second voltage signals Vn, Vr are set at the H level. Triggered by this, the gate-line drive circuit 30 sequentially activates the output signals $G_n$, $G_{n-1}$, $G_{n-2}$, . . . , $G_1$ at timings synchronized with the clock signals CLK, /CLK, as shown in FIG. 43. Thereby, the gate-line drive circuit 30 can sequentially drive the gate lines $GL_n$, $GL_{n-1}$, $GL_{n-2}$, . . . , $GL_1$ in a predetermined scanning cycle.

However, in this modification, at the time $t_{18}$ after the activation period of the unit shift register $SR_1$ of the most preceding stage expires, both of the first and second voltage signals Vn, Vr are set at the H level, and additionally both of the clock signals CLK, /CLK are set at the L level.

Thereby, in the unit shift register $SR_1$, the transistors Q31n, Q32n are turned ON to discharge the node N1. Thus, the unit shift register $SR_1$ shifts from the set state to the reset state. At this time, the transistors Q31r, 32r of the unit shift register $SR_n$ are also turned ON, but the third reverse-direction input terminal IN3r is set at the L level, and therefore the unit shift register $SR_n$ is kept in the reset state.

According to this modification, it is not necessary to provide the dummy unit shift register (the forward-direction dummy stage SRDn and the reverse-direction dummy stage SRDr) in the gate-line drive circuit 30. Therefore, the area where the circuit is formed can be reduced.

Preferred Embodiment 4

The preferred embodiments 1 to 3 aim at eliminating the need for a start pulse generation circuit. However, the circuit of FIG. 4 according to the present invention can also be used as a start pulse generation circuit. This is because a signal having the same waveform as that of the output signal G of the unit shift register SR can be normally used as a start pulse.

Figure 44:
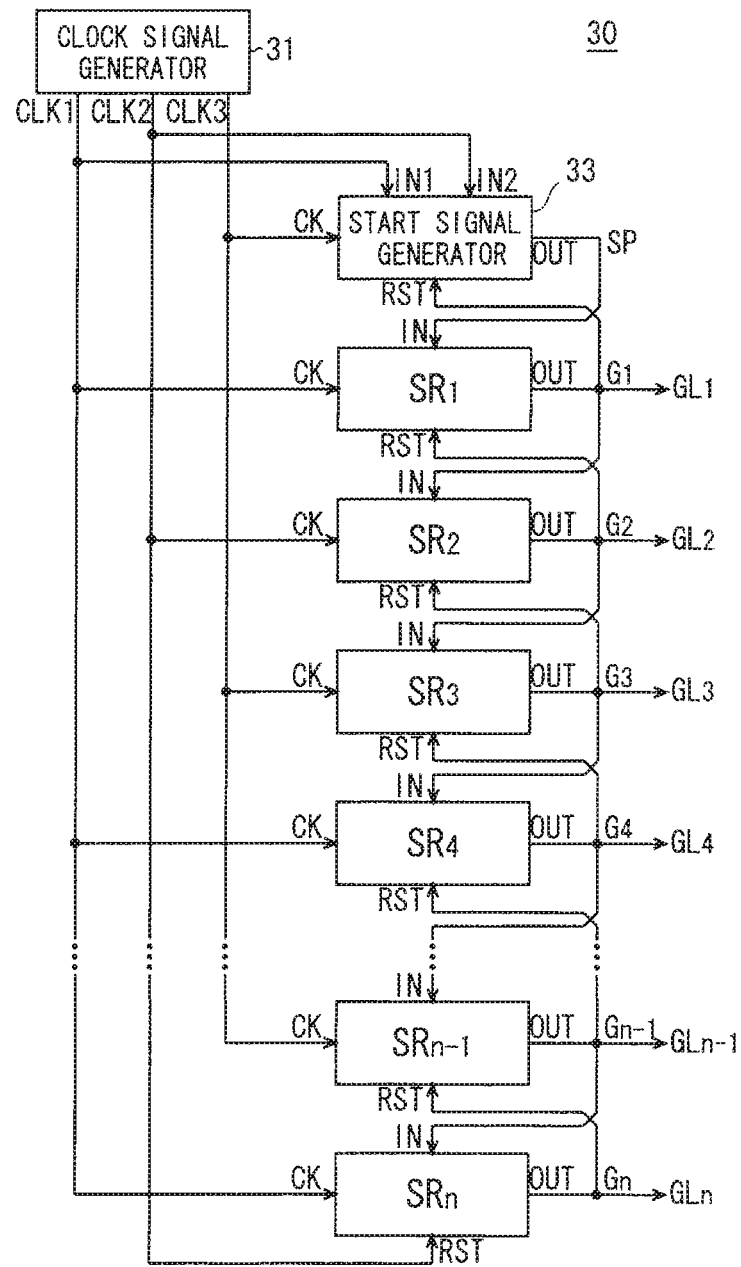
FIG. 44 is a block diagram of a gate-line drive circuit according to a preferred embodiment 4.

FIG. 44 shows a configuration of the gate-line drive circuit 30 in a case where the circuit of FIG. 4 is used as a start pulse generation circuit. In FIG. 44, each of the unit shift registers $SR_1$ to $SR_n$ which drive the gate lines $GL_1$ to $GL_n$ is configured as the circuit of FIG. 3. A start pulse generation circuit 33 which supplies a start pulse SP to the input terminal IN of the unit shift register $SR_1$ is configured as the circuit of FIG. 4.

The gate-line drive circuit 30 of FIG. 44 form a multi-stage shift register including the start pulse generation circuit 33. That is, in the gate-line drive circuit 30, a unit shift register serving as the start pulse generation circuit 33 and the unit shift registers SR1 to SRn which drive the gate lines GL 1 to GLn are dependently connected to one another, thereby forming a multi-stage shift register. It is not used for driving an output signal (start pulse SP) gate line GL of the start pulse generation circuit 33.

The output signal of the circuit of FIG. 4 is, at both of the H level and the L level, outputted with a low impedance. Therefore, the start pulse SP with a stable output level can be obtained.

This preferred embodiment is effective in using a start pulse for other applications. For example, when a signal (initial reset signal) for initializing each unit shift register SR into the reset state before a normal operation (such as when powered on), a start pulse can be used as a signal for ending an output of the initial reset signal in an initial reset signal generation circuit. Such an initial reset signal generation circuit is described in, for example, Japanese Patent Application No. 2009-025449 which is a patent application filed by the present inventor.

While the invention has been shown and described in detail, the foregoing description is in all aspects illustrative and not restrictive. It is therefore understood that numerous modifications and variations can be devised without departing from the scope of the invention.

What is claimed is:

1. A scanning-line drive circuit driven by using at least two clock signals of different phases, and including a plurality of cascade-connected unit shift registers, wherein
said scanning-line drive circuit is operable to perform a forward-direction shift for shifting a signal from an immediately preceding stage toward a subsequent stage and a reverse-direction shift for shifting a signal from a subsequent stage toward a immediately preceding stage in said plurality of unit shift registers,
said scanning-line drive circuit comprises:
a voltage signal generator;
a clock signal generator;
a first voltage signal terminal to which supplied is a first voltage signal set by the voltage signal generator which is set at an activation level at a time of the forward-direction shift and at a deactivation level at a time of the reverse-direction shift; and
a second voltage signal terminal to which supplied is a second voltage signal set by the voltage signal generator which is set at an activation level at a time of the reverse-direction shift and at a deactivation level at a time of the forward-direction shift,
said plurality of unit shift registers include:
a first unit shift register which activates an output signal when said first and second voltage signals are both set at an activation level at a time of the forward-direction shift; and
a second unit shift register which activates an output signal when said first and second voltage signals are both set at the activation level at a time of the reverse-direction shift,
wherein the first and second voltage signals are separate from a connection to a low-side power supply potential, VSS, a connection to a high-side power supply potential, VDD, and any output signals that are output from other unit shift registers, that are applied to each of the unit shift registers,
wherein at a time of the forward-direction shift, said first and second voltage signals are both set at the activation level at a timing corresponding to the beginning of each frame period based on a clock signal generated by the clock signal generator; and
wherein also at a time of the reverse-direction shift, said first and second voltage signals are both set at the activation level at a timing corresponding to the beginning of each frame period based on a clock signal generated by the clock signal generator.

2. The scanning-line drive circuit according to claim 1, wherein
said first unit shift register is the most preceding stage of the cascade connection,
said second unit shift register is the last stage of the cascade connection.

3. The scanning-line drive circuit according to claim 2, wherein output signals of said first and second unit shift registers are supplied to gate lines connected to pixels, respectively.

4. The scanning-line drive circuit according to claim 1, wherein
said first unit shift register comprises:
an output terminal which outputs said output signal;
a clock terminal to which a first clock signal is supplied;
a first input terminal to which said first voltage signal is supplied;
a second input terminal to which said second voltage signal is supplied;
a third input terminal to which a second clock signal is supplied;
a first transistor which supplies said first clock signal to said output terminal;
second and third transistors connected in series between said third input terminal and a first node to which a control electrode of said first transistor is connected; and
a fourth transistor having a control electrode to which an output signal of a next-stage unit shift register is inputted, said fourth transistor being connected between said first node and said second voltage signal terminal,
a control electrode of said second transistor is connected to said first input terminal,
a control electrode of said third transistor is connected to said second input terminal.

5. The scanning-line drive circuit according to claim 4, wherein
said first unit shift register is the most preceding stage of the cascade connection,
at a time of the reverse-direction shift, said first and second voltage signals are both set at the activation level and said second clock signal is set at the deactivation level, for a predetermined time period after an activation period of the output signal of said first unit shift register.

6. The scanning-line drive circuit according to claim 5, wherein
during said predetermined time period, said first clock signal is set at the deactivation level.

7. The scanning-line drive circuit according to claim 1, wherein
said second unit shift register comprises:
an output terminal which outputs said output signal;
a clock terminal to which a first clock signal is supplied;
a first input terminal to which said first voltage signal is supplied;
a second input terminal to which said second voltage signal is supplied;
a third input terminal to which a second clock signal is supplied;
a first transistor which supplies said first clock signal to said output terminal;
second and third transistors connected in series between said third input terminal and a first node to which a control electrode of said first transistor is connected; and
a fourth transistor having a control electrode to which an output signal of a unit shift register of an immediately preceding stage is inputted, said fourth transistor being connected between said first node and said first voltage signal terminal, a control electrode of said second transistor is connected to said first input terminal, a control electrode of said third transistor is connected to said second input terminal.

8. The scanning-line drive circuit according to claim 7, wherein said second unit shift register is the last stage of the cascade connection, at a time of the forward-direction shift, said first and second voltage signals are both set at the activation level and said second clock signal is set at the deactivation level, for a predetermined time period after an activation period of the output signal of said second unit shift register.

9. The scanning-line drive circuit according to claim 8, wherein during said predetermined time period, said first clock signal is set at the deactivation level.

\* \* \* \* \*